United States Patent
Armoni et al.

(10) Patent No.: US 9,390,208 B2
(45) Date of Patent: Jul. 12, 2016

(54) FORMAL VERIFICATION OF TEMPORAL PROPERTIES EXPRESSED USING LOCAL VARIABLES

(71) Applicant: Synopsys, Inc., Mountain View, CA (US)

(72) Inventors: Roy Armoni, Givat Ada (IL); Dana Fisman Ofek, New Haven, CT (US); Naiyong Jin, Shanghai (CN)

(73) Assignee: Synopsys, Inc., Mountain View, CA (US)

(*) Notice: Subject to any disclaimer, the term of this patent is extended or adjusted under 35 U.S.C. 154(b) by 301 days.

(21) Appl. No.: 13/918,046

(22) Filed: Jun. 14, 2013

(65) Prior Publication Data

US 2014/0372967 A1    Dec. 18, 2014

(51) Int. Cl.
| | | |
|---|---|---|
| *G06F 9/44* | (2006.01) | |
| *G06F 17/50* | (2006.01) | |
| *G06F 11/36* | (2006.01) | |
| *G06F 9/445* | (2006.01) | |

(52) U.S. Cl.
CPC ............... *G06F 17/504* (2013.01); *G06F 8/10* (2013.01); *G06F 8/20* (2013.01); *G06F 9/44589* (2013.01); *G06F 11/3688* (2013.01)

(58) Field of Classification Search
CPC .............. G06F 8/10; G06F 8/20; G06F 8/24; G06F 11/3688; G06F 11/3664; G06F 9/44589
See application file for complete search history.

(56) References Cited

U.S. PATENT DOCUMENTS

| | | | |
|---|---|---|---|
| 6,077,304 A | 6/2000 | Kasuya | |
| 6,591,403 B1 | 7/2003 | Bass et al. | |
| 7,810,056 B1 * | 10/2010 | Garg | G06F 17/505 716/104 |
| 8,050,902 B2 | 11/2011 | Behm et al. | |
| 8,448,109 B1 * | 5/2013 | Cerny | G06F 17/504 703/14 |
| 8,554,530 B1 * | 10/2013 | O'Riordan et al. | 703/14 |
| 8,924,938 B2 * | 12/2014 | Chang | G06F 11/3688 717/126 |
| 9,063,749 B2 * | 6/2015 | Ceze | G06F 8/44 |
| 2004/0049371 A1 * | 3/2004 | Fraer | G06F 17/504 703/14 |
| 2006/0156145 A1 * | 7/2006 | Mitra | G06F 17/504 714/742 |
| 2009/0064064 A1 * | 3/2009 | Eisner et al. | 716/5 |
| 2009/0216512 A9 | 8/2009 | Lee | |
| 2009/0216513 A1 * | 8/2009 | Pidan | G06F 17/504 703/14 |
| 2009/0249267 A1 * | 10/2009 | Cerny et al. | 716/5 |
| 2012/0233587 A1 * | 9/2012 | Rabinovich | G06F 8/10 717/105 |
| 2013/0019216 A1 * | 1/2013 | Vasudevan | G06F 17/504 716/106 |

(Continued)

OTHER PUBLICATIONS

Long et al. "Synthesizing SVA Local Variables for Formal Verification", ACM, DAC 2007, Jun. 4-8, 2007, San Diego, California, USA pp. 75-80; <http://dl.acm.org/results.cfm?h=1&cfid=678840066&cftoken=57943484>.*

(Continued)

*Primary Examiner* — Thuy Dao
*Assistant Examiner* — Ben C Wang
(74) *Attorney, Agent, or Firm* — Fenwick & West LLP

(57) ABSTRACT

A certain subset of temporal properties defined using local variables can be formally verified with complexity of PSPACE or less. A subset with this characteristic, referred to as a practical subset, is therefore feasible to formally verify. For example, it can be shown that temporal properties that possess an alternating automaton with no conflicts fall within a practical subset. Temporal properties are analyzed to determine whether they are a member of the practical subset. Members of the practical subset can then be feasibly formally verified.

17 Claims, 7 Drawing Sheets

(56) References Cited

U.S. PATENT DOCUMENTS

2013/0241941 A1* 9/2013 Donaldson .......... G06F 9/44589
 345/505
2015/0082263 A1* 3/2015 Vasudevan ............ G06F 17/504
 716/106

OTHER PUBLICATIONS

Godefroid et al. "Analysis of Boolean Programs", Microsoft Research, TechReport, MSR-TR-2012-71, Jul. 10, 2017, pp. 1-12; <http://research.microsoft.com/apps/pubs/defaultaspx?id=168940>.*

Armoni et al., "SVA and PSL Local Variables—A Practical Approach", Springer-Verlag Berlin Heidelberg, Jul. 2013, CAV 2013, LNCS 8044, pp. 197-212; <http://link.springer.com/chapter/10.1007%2F978-3-642-39799-8_13#page-1>.*

Long et al., "Synthesizing SVA local variables for formal verification", ACM, DAC 2007, Jun. 2007, pp. 75-80; <http://dl.acm.org/ft_gateway.cfm?id=1278500&ftid=426308&dwn=1&#URLTOKEN#>.*

Sonny et al., "OVL, PSL, SVA: Assertion Based Verification Using Checkers and Standard Assertion Languages", Dec. 2013, IEEE, pp. 1-4; <http://ieeexplore.ieee.org/stamp/stamp.jsp?tp=&arnumber=6938754>.*

Armoni, R. et al., "The ForSpec Temporal Logic: A New Temporal Property-Specification Language," J.-P. Katoen et al. (eds.), TACAS, vol. 2280 of Lecture Notes in Computer Science, 2002, pp. 296-211, Springer.

Armoni, R. et al., "SVA and PSL Local Variables—A Practical Approach," Oct. 11, 2012, pp. 1-21.

Beer, I. et al., "The Temporal Logic Sugar," Berry, G. et al. (eds.), CAV, vol. 2102 of Lecture Notes in Computer Science, Springer, 2001, pp. 363-367.

Ben-David, S. et al., "Automata Construction Algorithm Optimized for PSL," Technical Report Delivery 3.2/4, PROSYD, Jul. 2005, 56 pages.

Ben-David, S. et al., "Embedding Finite Automata Within Regular Expressions," Theor. Comput. Sci., 2008, pp. 202-218, vol. 404, No. 3.

Bustan, D. et al., "Automata Construction for PSL," Technical Report, Weizmann Institute of Science, May 2005, pp. 1-27.

Bustan, D. et al., "Some Complexity Results for System Verilog Assertions," Ball, T. et al. (eds.), CAV, Lecture Notes in Computer Science, Springer, 2006, 42 pages, vol. 4144.

Eisner, C. et al., "Augmenting a Regular Expression-Based Temporal Logic with Local Variables," A. Cimatti et al (eds.), FMCAD, IEEE, 2008, pp. 1-8.

IEEE Standard for SystemVerilog—Unified Hardware Design, Specification, and Verification Language, IEEE Std 1800™-2009, IEEE Computer Society, Dec. 11, 2009, 1285 pages.

Miyano, S., "Alternating Finite Automata on Omega-Words," Theoretical Computer Science, 1984, pp. 321-330, vol. 32.

PCT International Search Report and Written Opinion, PCT Application No. PCT/US14/42190, Oct. 22, 2014, 13 pages.

Pnueli, A., "The Temporal Logic of Programs," In FOCS, IEEE Computer Society, 1977, pp. 46-57.

* cited by examiner

FORMAL VERIFICATION OF TEMPORAL PROPERTIES EXPRESSED USING LOCAL VARIABLES

BACKGROUND OF THE INVENTION

1. Field of the Invention

This invention relates generally to the formal verification of a logic design, and more particularly, to the formal verification of temporal properties defined using local variables.

2. Description of the Related Art

SystemVerilog is a hardware design and verification language. SystemVerilog Assertions (SVA) is a subclass of SystemVerilog, used to declaratively specify functional behaviors of hardware designs. Similarly, Property Specification Language (PSL) is used to declaratively specify functional behaviors of hardware designs independent of the design language. Typically, SVA and PSL properties are validated during dynamic simulation or are formally verified.

SystemVerilog Assertions (SVA), as well as Property Specification Language (PSL) are linear temporal logics, extended with regular expressions and local variables. Moreover, it is known that the complexity of the verification problem for PSA or SVA is PSPACE-complete in the absence of (a) time windows, (b) intersection and (c) local variables. In addition, the verification problem for PSA or SVA with any one of these three renders the problem to the higher complexity class EXPSPACE. Furthermore, local variables create a complexity hurdle more easily. An upper bound is achieved by constructing an alternating Büchi automaton of size proportional to the size of the property and the size of the Cartesian product of the domains of the local variables. Seeing local variables of large domain is very common, for instance, when asserting data consistency on bus protocols. Thus, a 64-bit bus results in a single variable domain of size $2^{64}$. Building an alternating automaton of more than $2^{64}$ states may be possible, but for model checking it is translated into a non-deterministic Büchi automaton of more than $2^{(2^{64})}$ states, represented by $2^{64}$ state variables, which is infeasible.

The addition of local variables renders the verification problem of SVA and PSL formulae EXPSPACE-complete and therefore unpractical. Thus, there is a need for a practical method for formally verifying SVA and PSL formulae defined using local variables.

SUMMARY OF THE INVENTION

The present invention is based on the recognition that the verification complexity of a certain subset of temporal properties defined using local variables has complexity PSPACE or less. A subset with this characteristic, referred to generically as a practical subset, is therefore feasible to formally verify. Temporal properties are analyzed to determine whether they are a member of a practical subset. Members of a practical subset can then be feasibly formally verified.

In one aspect, verifying whether a hardware design satisfies a temporal property includes the following steps. An HDL description of the hardware design and the temporal property to be verified, which is expressed using a local variable, are both received as inputs to the process. It is determined whether the temporal property is a member of a "practical subset" of temporal properties. The practical subset has the characteristic that every member of the practical subset possesses an alternating automaton with no conflicts. An alternating automaton has no conflicts if none of its run-trees has a node with two descendants on the same depth that disagree on the value of the local variable. Temporal properties with this characteristic can be formally verified with complexity PSPACE or less. In one approach, formal verification is applied to all temporal properties that are determined to be members of the practical subset. In another approach, formal verification is not applied to all temporal properties that are determined not to be members of the practical subset.

In another aspect of the invention, whether a hardware design D satisfies a temporal property P is formally verified by constructing a non-deterministic automaton N and a deterministic satellite machine S, wherein the product N×S recognizes the negation of P, and determining whether the product D×N×S is empty. If the product is empty, then D satisfies P. Otherwise D does not satisfy P. In one approach, the deterministic satellite machine S handles updates of the local variable.

Other aspects of the invention include methods, devices, systems, applications, refinements, implementations and improvements related to the concepts described above.

BRIEF DESCRIPTION OF THE DRAWINGS

The invention has other advantages and features which will be more readily apparent from the following detailed description of the invention and the appended claims, when taken in conjunction with the accompanying drawings, in which:

The figures depict embodiments of the present invention for purposes of illustration only. One skilled in the art will readily recognize from the following discussion that alternative embodiments of the structures and methods illustrated herein may be employed without departing from the principles of the invention described herein.

DETAILED DESCRIPTION OF THE PREFERRED EMBODIMENTS

The figures and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Figure 1:
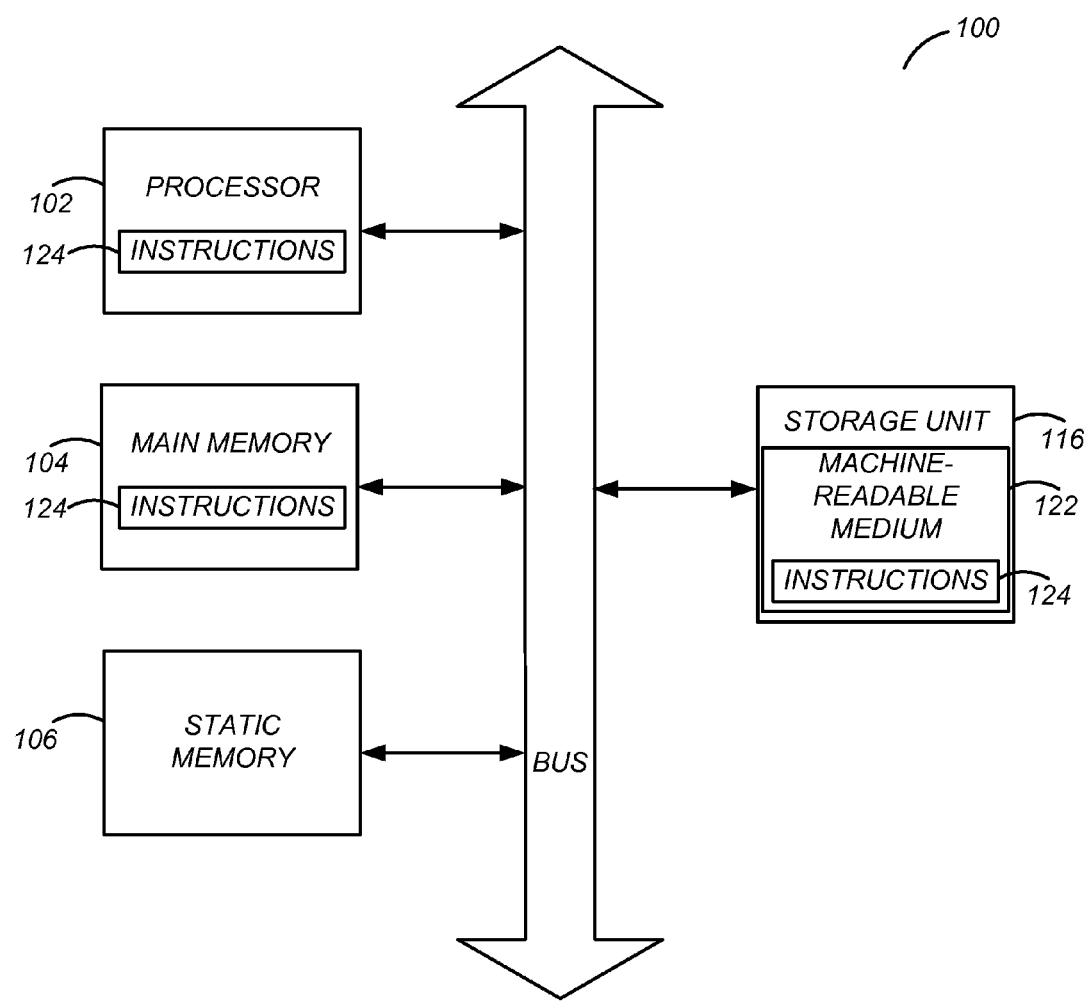
FIG. 1 illustrates one embodiment of components of an example machine able to read instructions from a machine-readable medium and execute them in a processor (or controller).

FIG. 1 is a block diagram illustrating components of an example machine able to read instructions from a machine-readable medium and execute them in a processor (or controller). Specifically, FIG. 1 shows a diagrammatic representation of a machine in the example form of a computer system 100 within which instructions 124 (e.g., software) for causing the machine to perform any one or more of the methodologies discussed herein may be executed. In alternative embodiments, the machine operates as a standalone device or may be connected (e.g., networked) to other machines. In a networked deployment, the machine may operate in the capacity of a server machine or a client machine in a server-client network environment, or as a peer machine in a peer-to-peer (or distributed) network environment.

The machine may be a server computer, a client computer, a personal computer (PC), or any machine capable of executing instructions 124 (sequential or otherwise) that specify actions to be taken by that machine. Further, while only a single machine is illustrated, the term "machine" shall also be taken to include any collection of machines that individually or jointly execute instructions 124 to perform any one or more of the methodologies discussed herein.

The example computer system 100 includes a processor 102 (e.g., a central processing unit (CPU), a graphics processing unit (GPU), a digital signal processor (DSP), one or more application specific integrated circuits (ASICs), a main memory 104, a static memory 106, and a storage unit 116 which are configured to communicate with each other via a bus 108. The storage unit 116 includes a machine-readable medium 122 on which is stored instructions 124 (e.g., software) embodying any one or more of the methodologies or functions described herein. The instructions 124 (e.g., software) may also reside, completely or at least partially, within the main memory 104 or within the processor 102 (e.g., within a processor's cache memory) during execution thereof by the computer system 100, the main memory 104 and the processor 102 also constituting machine-readable media.

While machine-readable medium 122 is shown in an example embodiment to be a single medium, the term "machine-readable medium" should be taken to include a single medium or multiple media (e.g., a centralized or distributed database, or associated caches and servers) able to store instructions (e.g., instructions 124). The term "machine-readable medium" shall also be taken to include any medium that is capable of storing instructions (e.g., instructions 124) for execution by the machine and that cause the machine to perform any one or more of the methodologies disclosed herein. The term "machine-readable medium" includes, but not be limited to, data repositories in the form of solid-state memories, optical media, and magnetic media.

Figure 2:
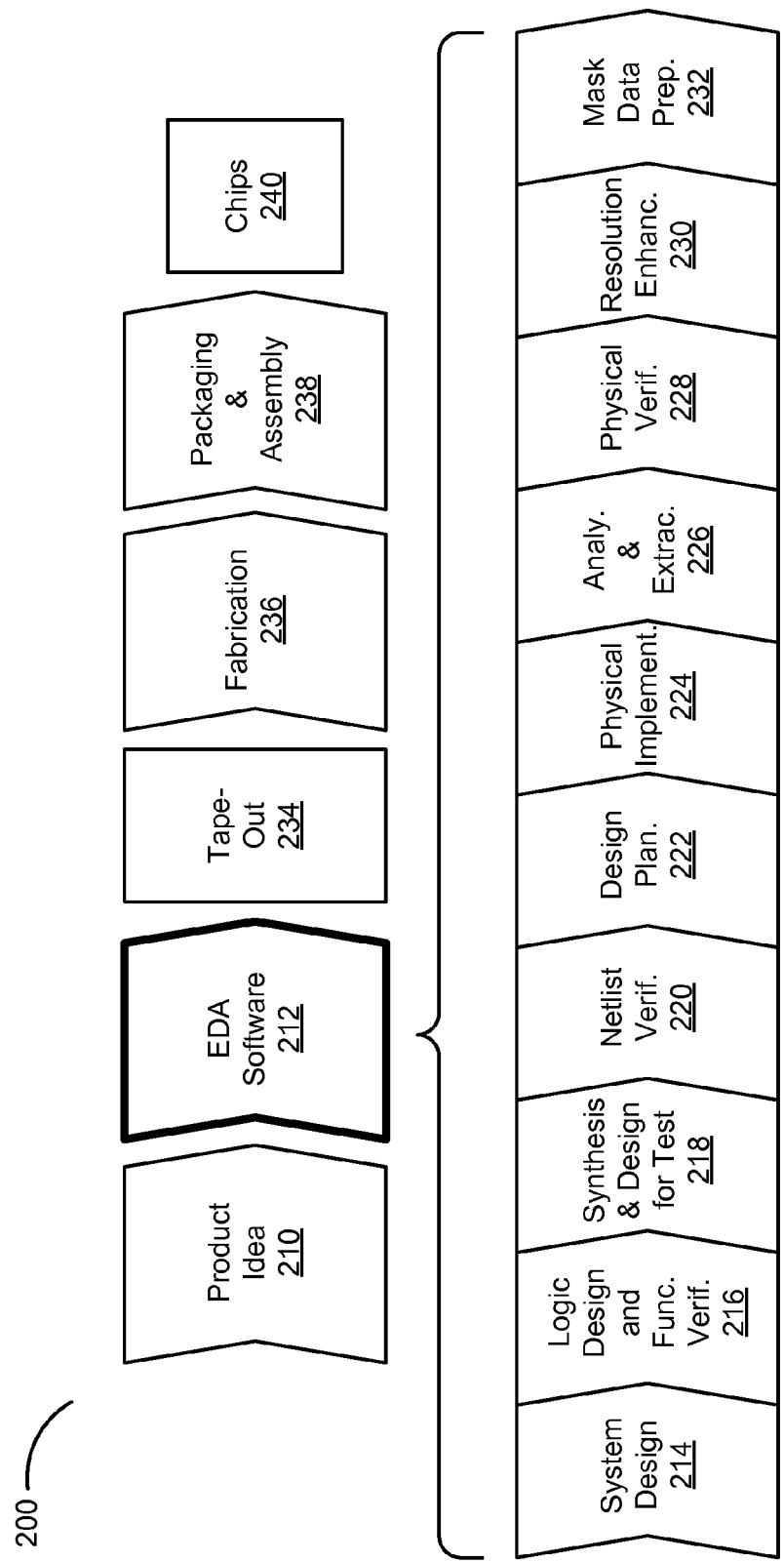
FIG. 2 is one embodiment of a flowchart illustrating various operations in the design and fabrication of an integrated circuit.

FIG. 2 is a flowchart 200 illustrating the various operations in the design and fabrication of an integrated circuit. This process starts with the generation of a product idea 210, which is realized during a design process that uses electronic design automation (EDA) software 212. When the design is finalized, it can be taped-out 234. After tape-out, a semiconductor die is fabricated 236 to form the various objects (e.g., gates, metal layers, vias) in the integrated circuit design. Packaging and assembly processes 238 are performed, which result in finished chips 240.

The EDA software 212 may be implemented in one or more computing devices such as the computer 100 of FIG. 1. For example, the EDA software 212 is stored as instructions in the computer-readable medium which are executed by a processor for performing operations 214-232 of the design flow, which are described below. This design flow description is for illustration purposes. In particular, this description is not meant to limit the present disclosure. For example, an actual integrated circuit design may require a designer to perform the design operations in a difference sequence than the sequence described herein.

During system design 214, designers describe the functionality to implement. They can also perform what-if planning to refine the functionality and to check costs. Note that hardware-software architecture partitioning can occur at this stage. Example EDA software products from Synopsys, Inc. of Mountain View, Calif. that can be used at this stage include: Model Architect®, Saber®, System Studio®, and Designware® products.

During logic design and functional verification 216, VHDL or Verilog code for modules in the circuit is written and the design is checked for functional accuracy. More specifically, the design is checked to ensure that it produces the correct outputs. Example EDA software products from Synopsys, Inc. of Mountain View, Calif. that can be used at this stage include: VCS®, Vera®, 10 Designware®, Magellan®, Formality®, ESP® and Leda® products.

During synthesis and design for test 218, VHDL/Verilog is translated to a netlist. This netlist can be optimized for the target technology. Additionally, tests can be designed and implemented to check the finished chips. Example EDA software products from Synopsys, Inc. of Mountain View, Calif. that can be used at this stage include: Design Compiler®, Physical Compiler®, Test Compiler®, Power Compiler®, FPGA Compiler®, Tetramax®, and Designware® products.

During netlist verification 220, the netlist is checked for compliance with timing constraints and for correspondence with the VHDL/Verilog source code. Example EDA software products from Synopsys, Inc. of Mountain View, Calif. that can be used at this stage include: Formality®, Primetime®, and VCS® products.

During design planning 222, an overall floor plan for the chip is constructed and analyzed for timing and top-level routing. Example EDA software products from Synopsys, Inc. of Mountain View, Calif. that can be used at this stage include: Astro® and IC Compiler® products.

During physical implementation 224, the placement (positioning of circuit elements) and routing (connection of the same) occurs. Example EDA software products from Synopsys, Inc. of Mountain View, Calif. that can be used at this stage include: the Astro® and IC Compiler® products.

During analysis and extraction 226, the circuit function is verified at a transistor level, which permits refinement. Example EDA software products from Synopsys, Inc. of Mountain View, Calif. that can be used at this stage include: Astrorail®, Primerail®, Primetime®, and Star RC/XT® products.

During physical verification 228, the design is checked to ensure correctness for: manufacturing, electrical issues, lithographic issues, and circuitry. Example EDA software products from Synopsys, Inc. of Mountain View, Calif. that can be used at this stage include the Hercules® product.

During resolution enhancement 230, geometric manipulations of the layout are performed to improve manufacturability of the design. Example EDA software products from Synopsys, Inc. of Mountain View, Calif. that can be used at this stage include: Proteus®, Proteus®AF, and PSMGED® products.

During mask-data preparation 232, the 'tape-out' data for production of masks to produce finished chips is provided. Example EDA software products from Synopsys, Inc. of Mountain View, Calif. that can be used at this stage include the CATS® family of products.

Various embodiments can be used during one or more of the above-described stages. Specifically, most if not all embodiments can be used in EDA software 212 that includes operations from stage 216: functional verification.

One form of functional verification is known as formal verification. In formal verification, the functionality of a hardware design is formally determined to be equivalent to the desired functionality. One subset of formal verification problems is the formal verification of properties. That is, the user defines a property that the hardware design is supposed to have. Formal verification then determines in a formally rigorous manner whether the hardware design actually conforms to the defined property. One subset of properties is temporal properties that are defined using a local variable. A local variable is one that is used only locally within the property definition. Unfortunately, the problem of formal verification of the class of all temporal properties defined using local variables is EXPSPACE-complete, which usually is computationally infeasible.

Figure 3:
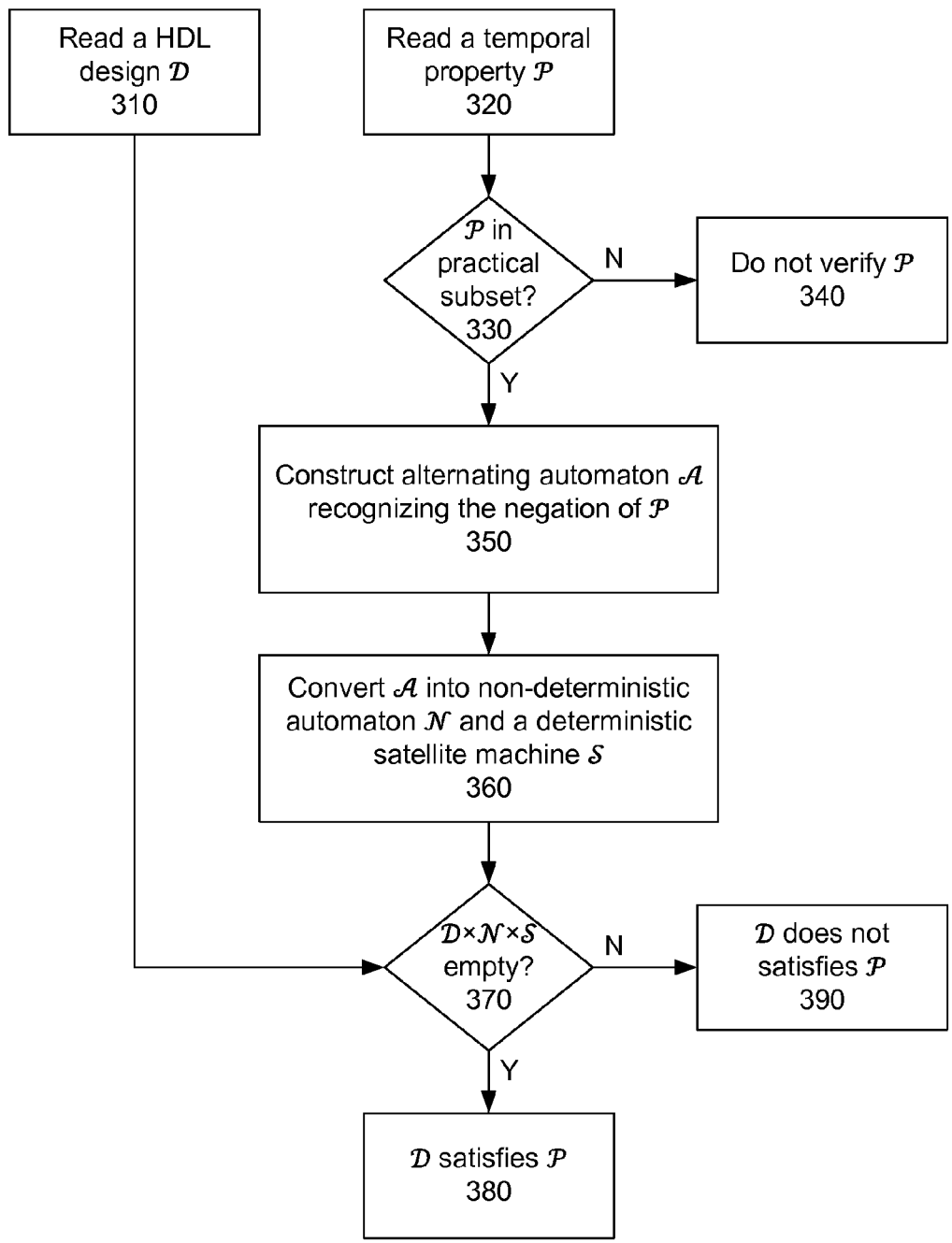
FIG. 3 is a flowchart for formally verifying a design against a temporal property defined using local variables.

However, FIG. 3 illustrates a flowchart for verifying a hardware design against a temporal property defined using local variables. The system reads or otherwise accesses 310 a description of a hardware design D, which is to be formally verified. The design D can be specified in a hardware description language (HDL) such as VHDL or Verilog. The system also reads or otherwise accesses 320 a temporal property P defined using a local variable. A temporal property is a property that is defined using temporal logic. The temporal property P can also be specified in a plurality of languages, such as SVA or PSL. The property P is analyzed to determine 330 if the property P is a member of a practical subset of temporal properties. Every member in the practical subset possesses an alternating automaton with no conflicts, and formal verification of these types of temporal properties can be shown to have complexity PSPACE or less so that they can be feasibly formally verified. Examples of practical subsets and how to determine whether a property is a member of a practical subset are given below and in the Appendix.

If the system determines that the temporal property P is a member of the practical subset, then it formally verifies whether the hardware design satisfies the property (steps 350-390). In an alternate approach, if the property P is not a member of the practical subset, then the system does not apply formal verification (step 340). In one embodiment, the system returns an error message indicating that the verification is not going to be performed or that the property is not supported by the system. In other embodiments, the system does not analyze the property but rather, it attempts to verify regardless of the verification complexity. In this case, if, during the verification process, the system determines that the verification is impractical (e.g. it is using more than a threshold amount of memory space, and/or it has been running longer than a threshold amount of time), then the verification is aborted and an error message can be sent to the user.

FIG. 3 shows one approach to formal verification of properties P that are in the practical subset. In this embodiment, an alternating automaton A, recognizing the negation of property P, is constructed 350. This automaton A is converted 360 into a non-deterministic automaton N and a deterministic satellite machine S such that the product N×S recognizes the same set of words (i.e. same language) as A. In one approach, the construction 350 of alternating automaton A includes annotations, which identify which portions of the automaton A are used to construct the non-deterministic automaton N and which portions are used to construct the deterministic satellite machine S. The portion involving local variables is used to construct the deterministic satellite machine S and the remaining portion is used to construct the non-deterministic automaton N. The portion involving local variables essentially controls or determines the updates of the local variables. From that portion, one can deduce the exact value of each local variable at each time point. The satellite machine S can look at the non-deterministic automaton N. That is, N's current state can be treated as part of the inputs to satellite machine S. The non-deterministic machine N, on the other hand, cannot look at the satellite S. That is, S's current state is not part of N's input. The value of the local variables before the current update took place, however, may be part of N's input.

The design D is formally verified by determining 370 whether the Cartesian product D×N×S is empty. On the one hand, if the product is empty 380, then D satisfies P. In one embodiment, a message is returned indicating the successful formal verification of the design against the property. On the other hand, if the product is not empty 390, then D does not satisfy P. In one embodiment, an error message is returned indicating the unsuccessful verification of the design against the property. In one approach, a negative answer 390 is accompanied by a counter example, such as one of the words in D×N×S.

The determination of the complexity of the verification process is performed by determining whether the property lies within the practical subset. A formal proof for an example of a practical subset (denoted $PSL^{pract}$) is attached as an Appendix. In that example, any temporal property that is defined with local variables where the local variables are limited to {the temporal operators next!, until!, releases and suffix implication} belongs to the practical subset, as long as there are no assignments to local variables on either the right operand of until! or the left operand of releases. Furthermore, in order to deal with negation applied to temporal operators, a pre-processing step that transforms a PSL formula to an equivalent formula in positive normal form, by using duality rules, can be added. In one embodiment, the determination whether a property is a member of the practical subset $PSL^{pract}$ is performed by constructing a parse tree and traversing the parse tree to search for possibly problematic operators, which in this example are until! and releases. If a possibly problematic operator is found, then its operands can be analyzed to determine if an assignment to a local variable was performed in the operand (e.g. an assignment to local variables on the right operand of until! or the left operand of release). If an assignment to local variables is found, then the property is determined to not be in the practical subset. Otherwise, the property is in the practical subset.

Other approaches to the practical subset are possible. For example, in one approach, the following uses of local variables is permitted: (a) use of local variables in non-temporal operators; (b) the use of local variables in temporal operators, so long as there are no uses that would result in conflicts in the corresponding alternating automaton. A property can be traversed, with each local variable usage checked to confirm that it falls within one of the permitted uses. If all local variable usage is permitted, then the property is in the practical subset. Alternately, the property can be traversed to determine if any local variable usage is not permitted, for example if there is an assignment to a local variable that would result in a conflict for the corresponding alternating automaton. In yet another approach, one can build the annotated alternating automaton and check directly on the automaton if there are conflicts. This approach might be useful, for example, if it is difficult to determine whether there is a conflict solely by examining the operators and operands (or the parse tree).

Figure 4:
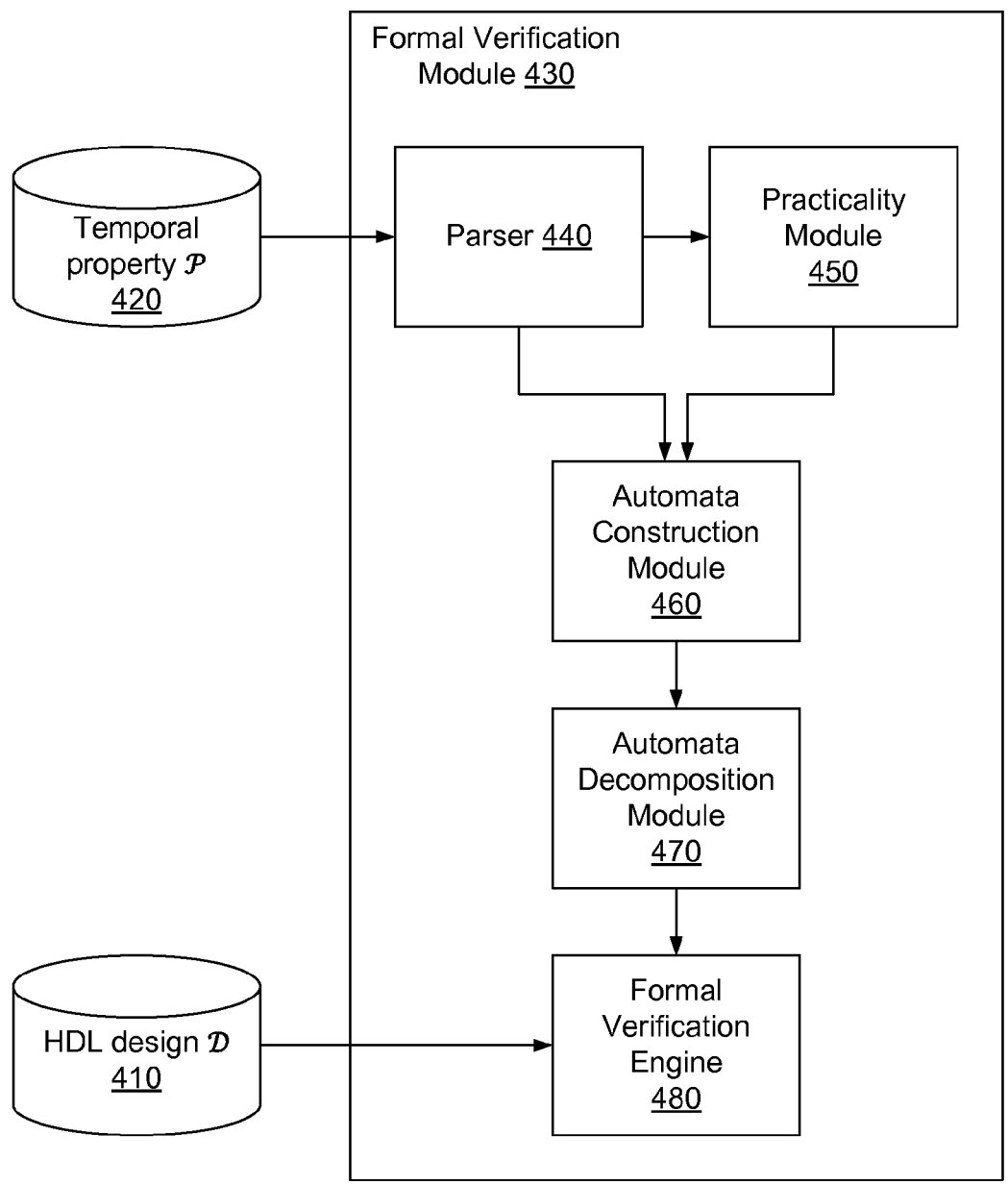
FIG. 4 is a block diagram of a system architecture for formally verifying a design against a temporal property defined using local variables.

FIG. 4 is a block diagram of a system architecture for formally verifying a design against a temporal property defined using local variables, in accordance with an embodiment of the invention. The formal verification module 430 receives as an input a temporal property P 420 and an HDL design D 410. The formal verification module 430 includes a parser 440, a practicality module 450, an automata construction module 460, an automata decomposition module 470 and a formal verification engine 480. In other embodiments, the formal verification module 430 may include additional, fewer, or different modules for various applications.

The parser 440 analyzes the temporal property P 420 according to the grammar or rules of the language used to define it (e.g. SVA, PSL, etc). In some embodiments, the parser performs a lexical analysis to obtain a list of tokens contained in the temporal property 420. During the lexical analysis, the temporal properly P 420 is divided into meaningful symbols (e.g. operators, operands, parenthesis, etc). The parser 440 can then perform a syntactic analysis. During the syntactic analysis, the parser analyzes the tokens to understand the meaning of the temporal logic 420 in order to create a parse tree. In some embodiments, the parser first searches for an operator. After an operator is found, the parser searches for the operands of the operator. For example, for the temporal logic expression "a until b," during the lexical analysis, the parser 440 will obtain the tokens "a," "until," and "b." Then during the syntactic analysis the parser will determine that the token "until" is an operator and the tokens "a" and "b" are its operands. In one embodiment, the parser 440 distinguishes the different types of operands that an operator has. For instance, in the previous example, "a" is a left operand, and "b" is a right operand. In some embodiments, the parser searches for operators in a hierarchical order. In one embodiment, the parser may additionally analyze the temporal logic 420 for syntax error. If a syntax error if found by the parser 440, an error can be return prompting the user to correct the syntax error.

The practicality module 450 analyzes the output of the parser 440 and determines whether it is feasible to formally verify the property P. In one approach, the practicality module 450 does this by determining whether the temporal property P 420 is a member of a practical subset of temporal properties, where it is known that all members of the practical subset can be formally verified with complexity PSPACE or less. For example, the practical subset may contain all temporal properties that possess an alternating automaton with no conflicts.

In one approach, to determine whether a temporal property 420 is in the practical subset, the practicality module 450 traverses the parse tree constructed by the parser 440 and searches for problematic operators. If a problematic operator is found, then the practicality module 450 determines whether there is an assignment to a local variable in one of the operands. If the practicality module 450 finds an assignment to a local variable on a problematic operator (e.g. on the right operand of until!, the left operand of release, etc), then the temporal property is not in the practical subset and the practicality module 450 returns an appropriate message, possibly an error message. If the temporal property 420 is in the practical subset, the practicality module 450 instructs the formal verification module 430 that formal verification for the temporal property P 420 is possible.

In another approach, the practicality module 450 builds the alternating automaton (or has the automata construction module 460 build the alternating automaton) and then looks for conflicts directly in the alternating automaton.

The automata construction module 460 constructs an alternating automaton A recognizing the negation of the temporal property P 420. In some embodiments, A is an annotated alternating automaton.

The automata decomposition module 470 converts the annotated alternating automaton A into a non-deterministic un-annotated automaton N and a deterministic satellite machine S such that the product N×S recognizes the same set of words as A. As a result, the automata decomposition module 470 separates the part responsible for local variable updates from the alternating automaton and constructs a satellite that monitors the automaton to determine the local variables' next state. In order to transform the alternating automaton into a non-deterministic automaton, the automata decomposition module 470 applies the Miyano-Hayashi construction on A by disregarding the local variables, thus avoiding the exponential penalty of the Miyano-Hayashi construction on the local-variables-part of A.

The formal verification engine 480 verifies the HDL design D 410 by analyzing the product D×N×S. If the product is empty, then the HDL design 410 satisfies the temporal property P 420. Otherwise, the HDL design D 410 does not satisfy the temporal property P 420 and the formal verification module 430 returns a message indicating the result of the analysis.

Although the detailed description contains many specifics, these should not be construed as limiting the scope of the invention but merely as illustrating different examples and aspects of the invention. It should be appreciated that the scope of the invention includes other embodiments not discussed in detail above. Various other modifications, changes and variations which will be apparent to those skilled in the art may be made in the arrangement, operation and details of the method and apparatus of the present invention disclosed herein without departing from the spirit and scope of the invention as defined in the appended claims. Therefore, the scope of the invention should be determined by the appended claims and their legal equivalents.

In alternate embodiments, the invention is implemented in computer hardware, firmware, software, and/or combinations thereof. Apparatus of the invention can be implemented in a computer program product tangibly embodied in a machine-readable storage device for execution by a programmable processor; and method steps of the invention can be performed by a programmable processor executing a program of instructions to perform functions of the invention by operating on input data and generating output. The invention can be implemented advantageously in one or more computer programs that are executable on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors. Generally, a processor will receive instructions and data from a read-only memory and/or a random access memory. Generally, a computer will include one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing can be supplemented by, or incorporated in, ASICs (application-specific integrated circuits) and other forms of hardware.

APPENDIX

1. OVERVIEW

The precise definition of a set of temporal properties considered by this Appendix, denoted by $\text{PSL}^{\text{pract}}$, is given in Definition 9. In this Appendix, we prove that the complexity for formal verification of any property in the set $\text{PSL}^{\text{pract}}$ is PSPACE or less. That is, we prove Theorem 1. Accordingly, the set $\text{PSL}^{\text{pract}}$ is a practical subset.

Theorem 1: The space complexity of the verification problem of any formula $\varphi$ in $\text{PSL}^{\text{pract}}$ is polynomial in $|\varphi|$.

The proof of Theorem 1 is done by constructing an alternating Büchi automaton $\mathcal{A}$ whose size $|\mathcal{A}|$ is polynomial in $|\varphi|$ and its language $\mathcal{L}(\mathcal{A}) = \mathcal{L}(\varphi)$. By that we reduce the verification problem of formulae to the emptiness problem of alternating Büchi automata. Embodiments of the invention separate the part responsible for local variables updates from the alternating automaton, and use a satellite that monitors the automaton to determine the local variables' next state value. Then, in order to transform the alternating automaton into a non-deterministic one, we apply the Miyano-Hayashi construction on an alternating automaton that is constructed for the property $\varphi'$ obtained from $\varphi$ by disregarding the local variables, thus avoiding the exponential penalty of the Miyano-Hayashi construction on the local-variables-part of the formula. Such a manipulation is valid conditioned in a run tree of the alternating automaton there are no two states at the same depth that disagree on the value of a local variable. We call an automaton adhering to this property *conflict-free*. Conflicts may arise because of updates after a universal branch. If the universal branch is not involved in a loop we can solve the conflict by introducing new local variables to the different branches; however, if it is involved in a loop we simply cannot. The construction for formulae of the practical subset guarantees that no local variable assignment occurs after a loop that contains a universal branch.

2. BACKGROUND

We provide the syntax and semantics for the core of PSL with local variables, which we denote $\text{PSL}^{+V}$. $\mathcal{P}$ is a non-empty set of atomic propositions and $\mathcal{V}$ is a set of local variables with domain $\mathcal{D}$. We further assume a given set $\mathcal{E}$ of (not necessarily Boolean) expressions over $\mathcal{P} \cup \mathcal{V}$, and a given set $\mathcal{B} \subseteq \mathcal{E}$ of Boolean expressions. That is, a Boolean expression may refer to both atomic propositions and local variables. For instance $p \wedge x = 7$ is a Boolean expression stating that proposition $p \in \mathcal{P}$ holds and local variable $x \in \mathcal{V}$ has the value 7. In contrast, assignments to local variables are not part of a Boolean expression. They are given separately as the second component of an assignment pair whose first component is a Boolean expression. For instance, $(b, x := 7)$ is an assignment pair that reads "the boolean expression $b$ holds and local variable $x$ should be assigned 7". Any expression $e \in \mathcal{E}$ can be assigned to a local variable. It is also allowed to have a sequence of local variable assignments in an assignment pair. Given a sequence of local variable $X = x_1, \ldots, x_n$ and a sequence of expressions $E = e_1, \ldots, e_n$ of the same length we write $X := E$ to abbreviate $x_1 := e_1, \ldots, x_n := e_n$. Thus, $(b, X := E)$ is a legal assignment pair.

Formulae of PSL are defined with respect to regular expressions extended with local variables ($\text{RE}^{+V}$s). The atoms of an $\text{RE}^{+V}$ are Boolean expressions or assignment pairs. On top of these the regular operators of Concatenation, Kleene's closure and Or are applied.

2.1 SYNTAX OF $\text{PSL}^{+V}$

<u>Definition 2 (Regular expressions extended with local variables ($\text{RE}^{+V}$s))</u>: Let X be a sequence of local variables and E a sequence of expressions of the same length as X.

- *If $b \in \mathcal{B}$ is a Boolean expression then the following are $RE^{+V}$s:*
    - $b$                          *meaning Boolean expression b holds*
    - $(b, X := E,)$       *meaning b holds and the variables in X are assigned with expressions in E*
- *If $r$, $r_1$, and $r_2$ are $RE^{+V}$s then the following are $RE^{+V}$s:*
    - $\lambda$                          *meaning the empty RE+V*
    - $r_1 \cdot r_2$                  *meaning concatenation*
    - $r_1 \cup r_2$                 *meaning union*
    - $r^+$                        *meaning positive bounded repetition*

- $(new(X)\ r)$      *meaning declaration of local variables in X in parenthesis scope*
- $(new(X := E)\ r)$      *meaning declaration of local variables in X with initial values E*
- $(free\ (X)\ r)$      *meaning removal of local variables X from parenthesis scope*

PSL formulae are built out of $RE^{+V}$s. The usual disjunction and conjunction can be applied to PSL formulae. The temporal operators consist of the *next!*, *until!*, *releases* and the *suffix implication operator* ($\mapsto$ or *triggers*). Loosely speaking $r \mapsto \varphi$ hold on a word $w$ if every prefix of $w$ that matches $r$ is followed by a suffix on which $\varphi$ holds.

<u>Definition 3 ($PSL^{+V}$ formulae)</u>: If $\varphi$, $\varphi_1$, $\varphi_2$ are $PSL^{+V}$ formulae, r an $RE^{+V}$, X a sequence of local variables and E a sequence of expressions of the same length as X then the following are $PSL^{+V}$ formulae:

- $r!$      *meaning a prefix should match r*
- $\neg \varphi$      *meaning negation*
- $\varphi_1 \wedge \varphi_2$      *meaning conjunction*
- $next!\ \varphi$      *meaning $\varphi$ holds at the subsequent time step*
- $\varphi_1\ until!\ \varphi_2$      *meaning $\varphi_2$ eventually holds and until then $\varphi_1$ holds*
- $r \mapsto \varphi$      *meaning suffix implication (aka triggers)*
- $(new(X)\ \varphi)$      *meaning declaration of local variables X in parenthesis scope*
- $(new(X := E)\ \varphi)$      *meaning declaration of local variables X with initial values E*
- $(free(X)\ \varphi)$      *meaning removal of local variables X from parenthesis scope*

We use the following common syntactic sugaring operators.

- $\varphi_1 \vee \varphi_2 \stackrel{def}{=} \neg \varphi_1 \wedge \neg \varphi_2$      *meaning disjunction*
- $eventually!\ \varphi \stackrel{def}{=} true\ until!\ \varphi$      *meaning $\varphi$ should eventually hold*
- $always\ \varphi \stackrel{def}{=} \neg\ eventually!\ \neg\varphi$      *meaning $\varphi$ should hold at all times*
- $\varphi_1\ releases\ \varphi_2 \stackrel{def}{=} \neg(\neg\varphi_1\ until!\ \neg\varphi_2)$      *meaning $\varphi_2$ should hold until $\varphi_1$ does (including)*
- $r \diamond\!\!=\!\!\diamond\ \varphi \stackrel{def}{=} \neg(r \mapsto \neg\varphi)$      *meaning on some path $\varphi$ should hold after a match of r*

Example 4: Let {start, end, data_in, data_out} ⊆ $\mathcal{P}$, and $x \in \mathcal{V}$. The formula $(new(x)\ \varphi_1)$ where $$\varphi_1 = always(((\neg start)^+ \cdot (start, x := data_{in})) \mapsto (\neg end)^+ \cdot end \wedge (data_{out} = x))$$

states that if the value of data_in is $x$ when transaction starts (signal start rises) then the value of data_out should be $x$ when the transaction ends (signal end rises). That is, values are transferred correctly from data_in to data_out.

Example 5: Let {start, end, get, put} ⊆ $\mathcal{P}$, and $x \in \mathcal{V}$. Assume put, get and end are mutually exclusive (that is, if one of them holds the others do not). Let not_pge denote the expression ($\neg$put $\wedge$ $\neg$get $\wedge$ $\neg$end). Then the formula $(new(x)\ \varphi_2)$ where $$\varphi_2 = always((start, x := 0) \cdot (not\_pge \cup (put, x{+}{+}) \cup (get, x{-}{-}))^+ \cdot end) \mapsto x = 0$$

states that the number of puts and gets between start and end should be the same. More accurately, since the domain of variables is bounded, the number should be the same modulo the size of $\mathcal{D}$ assuming ++ and -- increment and decrement modulo $|\mathcal{D}|$, respectively.

This formula does not demand seeing the end of a transaction (signal end holds) once a transaction has started (signal start holds). One thus might use instead the following formula, which does demand that.

$$\varphi_3 = always(start, x := 0) \mapsto (not\_pge \cup (put, x{+}{+}) \cup (get, x{-}{-}))^+ \cdot end \cdot x = 0$$

2.2 Semantics of $PSL^{+V}$

The semantics of $PSL^{+V}$ formulae is defined with respect to a word over the alphabet $\Sigma = 2^{\mathcal{P}}$ (the set of all possible valuations of the atomic propositions) and a letter from the alphabet $\Gamma = \mathcal{D}^{\mathcal{V}}$ (the set of all possible valuations of the local variables). The semantics of $RE^{+V}$ is defined with respect to words from the alphabet $\Lambda = \Sigma \times \Gamma \times \Gamma$. We call words over $\Lambda$ extended words. A letter $\langle \sigma, \gamma, \gamma' \rangle$ of an extended word provides a valuation $\sigma$ of the atomic propositions and two valuations $\gamma$ and $\gamma'$ of the local variables. The valuation $\gamma$ corresponds to the value of the local variables before assignments have taken place, the pre-value, and the valuation $\gamma'$ corresponds to the value of the local variables after they have taken place, the post-value.

In the sequel we use $\sigma$ to denote letters from the alphabet $\Sigma$, $\gamma$ to denote letters from $\Gamma$, and $\mathbb{a}$ to denote letters from $\Lambda$. We use $u, v, w$ to denote words over $\Sigma$ and $\mathbb{u}, \mathbb{v}, \mathbb{w}$, to denote words over $\Lambda$.

We use $i, j$ and $k$ to denote non-negative integers. We denote the $i^{th}$ letter of $v$ by $v^{i-1}$ (since counting of letters starts at zero). We denote by $v^{i..}$ the suffix of $v$ starting at $v^i$, and by $v^{i..j}$ the finite sequence of letters starting from $v^i$ and ending at $v^j$. We use $|v|$ to denote the *length* of $v$. The empty word $\epsilon$ has length 0, a finite word $\sigma_0 \sigma_1 \ldots \sigma_k$ has length $k + 1$, and an infinite word $v$ has length $\infty$. The notations for extended words $\mathbb{w}^i$, $\mathbb{w}^{i..}$, $\mathbb{w}^{i..j}$, $|\mathbb{w}|$ are defined in the same manner.

Let $\mathbb{w} = \langle \sigma_0, \gamma_0, \gamma'_0 \rangle \langle \sigma_1, \gamma_1, \gamma'_1 \rangle \cdots$ be a word over $\Lambda$. We use $\mathbb{w}|_\sigma, \mathbb{w}|_\gamma, \mathbb{w}|_{\gamma'}$ to denote the projection of $\mathbb{w}$ onto the first, second or third component, respectively, of each letter. That is, $\mathbb{w}|_\sigma = \sigma_0 \sigma_1 \cdots$, $\mathbb{w}|_\gamma = \gamma_0 \gamma_1 \cdots$, $\mathbb{w}|_{\gamma'} = \gamma'_0 \gamma'_1 \cdots$. We use $\mathbb{w}|_{\sigma\gamma}$ to denote the projection of $\mathbb{w}$ onto both the first and second components. That is, $\mathbb{w}|_{\sigma\gamma} = \langle \sigma_0 \gamma_0 \rangle \langle \sigma_1 \gamma_1 \rangle \cdots$. We say that an extended word $\mathbb{w}$ is *good* if for every $i \in \{0, 1, \ldots, |\mathbb{w}| - 2\}$ we have $(\mathbb{w}|_\gamma)^{i+1} = (\mathbb{w}|_{\gamma'})^i$, i.e., the pre-value of the local variables at letter $i + 1$ is the post-value at letter $i$.

2.2.1 SEMANTICS OF EXPRESSIONS

An expression $e \in \mathcal{E}$. over $\mathcal{P} \cup \mathcal{V}$ is identified with a mapping $e : \Sigma \times \Gamma \mapsto \mathcal{D}$ where $\mathcal{D}$ is the domain of variables in $\mathcal{V}$ Boolean expression $b \in \mathcal{B}$ is an expression whose domain is $\{\text{T}, \text{F}\}$, and we define *true* and *false* to be the Boolean expressions whose domains are $\{\text{T}\}$ and $\{\text{F}\}$, respectively.

We assume that for an atomic proposition $p$ we have that $p(\sigma, \gamma) = \text{T}$ if $p \in \sigma$ and F otherwise, and that for a local variable $v$ we have that $v(\sigma, \gamma)$ returns the value of $v$ in $\gamma$. We assume that operators are closed under $\mathcal{D}$ and behave in the usual manner, i.e. that for $\sigma \in \Sigma$, $\gamma \in \Gamma$, $e, e_1, e_2 \in \mathcal{E}$, a binary operator $\otimes$ and a unary operator $\odot$ we have $e_1(\sigma, \gamma) \otimes e_2(\sigma, \gamma) = (e_1 \otimes e2)(\sigma, \gamma)$ and $\odot \big(e(\sigma, \gamma)\big) = (\odot e)(\sigma, \gamma)$. In particular, we assume that Boolean disjunction, conjunction and negation behave in the usual manner.

We use := for local variable assignments. Given a local variable $x$ and an expression $e$ we write $[\![x := e]\!](\sigma,\gamma)$ to denote the valuation $\hat{\gamma}$ such that $x(\hat{\gamma}) = e(\sigma,\gamma)$ and for every local variable $v \in \mathcal{V} \setminus \{x\}$ we have that $v(\hat{\gamma}) = v(\gamma)$. Given a sequence of local variable $X = x_1, \ldots, x_n$ and a sequence of expressions $E = e_1, \ldots, e_n$ of the same length, we write $[\![x_1 := e_1, \ldots x_n := e_n]\!](\sigma,\gamma)$ to denote the recursive application $[\![x_2 := e_2, \ldots x_n := e_n]\!](\sigma, [\![x_1 := e_1]\!](\sigma,\gamma))$. Recall that we write $X := E$ to abbreviate $x_1 := e_1, \ldots, x_n := e_n$. More generally, we use $\mathcal{U}$ to denote the set of all possible sequences of assignments to variables over $\mathcal{V}$. We use U, U$_1$, U$_2$ to denote elements of $\mathcal{U}$ and use $\varepsilon$ to denote the empty assignment sequence. For U$_1$, U$_2$ $\in \mathcal{U}$ we use U$_1 \cdot$ U$_2$ to denote the application of assignments U$_2$ after assignments in U$_1$ took place.

2.2.2 SEMANTICS OF RE$^{+V}$s

The semantics of RE+$^V$ is defined with respect to a finite good word over $\Lambda$ and a set of local variables $Z \subseteq \mathcal{V}$, and is given in Definition 6. The role of the set $Z$, which is referred to as the set of *controlled variables*, is to support scoping. Any variable in Z (i.e. a variables in scope) must keep its value if not assigned and take on the assigned value otherwise, whereas any variable not in Z (i.e. a variables not in scope) is free to take on any value.

Let $Z \subseteq \mathcal{V}$. We use $\gamma_1 \stackrel{Z}{\sim} \gamma_2$ (read "$\gamma_1$ agrees with $\gamma_2$ relative to Z") to denote that for every $z \in Z$ we have that $z(\gamma_1) = z(\gamma_2)$. Given good extended words $\mathrm{v},\mathrm{w}$ we use $\mathrm{v} \stackrel{Z}{\sim} \mathrm{w}$ to denote that $\mathrm{v}|_\sigma = \mathrm{w}|_\sigma$ and for every $i < |\mathrm{v}|$ we have $\mathrm{v}^i|_\gamma \stackrel{Z}{\sim} \mathrm{w}^i|_\gamma$. We say that $\mathrm{v}$ *preserves* Z if for every $z \in Z$ and for every $i < |\mathrm{v}|$ we have $z(\mathrm{v}^i|_{\gamma'}) = z(\mathrm{v}^i|_\gamma)$.

<u>Definition 6 (Tight satisfaction)</u>: Let b be a Boolean expression, r, r$_1$, r$_2$ RE$^{-V}$s. Let Z be a set of local variables, X be a sequence of local variables and E a sequence of expression of same size. Let $\mathrm{v}, \mathrm{v}_1, \ldots, \mathrm{v}_k$ be good extended words. The notation $\mathrm{v} \models_z \mathrm{r}$ means that $\mathrm{v}$ tightly satisfies r with respect to controlled variables Z.

- $\mathrm{v} \equiv_z b$             $\Leftrightarrow$   $|\mathrm{v}| = 1$ and $b(\mathrm{v}^0|_{\sigma\gamma}) = T$ and $\mathrm{v}^0|_{\gamma'} \stackrel{Z}{\sim} \mathrm{v}^0|_\gamma$
- $\mathrm{v} \equiv_z (b, X := E)$    $\Leftrightarrow$   $|\mathrm{v}| = 1$ and $b(\mathrm{v}^0|_{\sigma\gamma}) = T$ and $\mathrm{v}^0|_{\gamma'} \stackrel{Z}{\sim} [\![X := E]\!](\mathrm{v}^0|_{\sigma\gamma})$
- $\mathrm{v} \equiv_z \lambda$             $\Leftrightarrow$   $\mathrm{v} = \epsilon$

- $v \models_z r_1 \cdot r_2$ $\iff$ $\exists v_1, v_2 \text{ such that } v = v_1 v_2 \text{ and } v_1 \models_z r_1 \text{ and } v_2 \models_z r_2$
- $v \models_z r_1 \cup r_2$ $\iff$ $v \models_z r_1 \text{ or } v \models_z r_2$
- $v \models_z r^+$ $\iff$ $\exists k \geq 1 \text{ and } v_1, v_2, \ldots, v_k \text{ such that}$
  $v = v_1 v_2 \ldots v_k \text{ and } v_i \models_z r \text{ for every } 1 \leq j \leq k$
- $v \models_z (new(X)\, r)$ $\iff$ $v \models_{z \cup X} r$
- $v \models_z (new\,(X := E)\, r)$ $\iff$ either $(v = \epsilon \text{ and } \epsilon \models_z r)$ or
  $\langle v^0|_\sigma, [\![X := E]\!](v^0|_{\sigma\gamma}),\, v^0|_{\gamma'}\rangle v^{1..} \models_{z \cup X} r$
- $v \models_z (free(X)\, r)$ $\iff$ $v \models_{z \setminus X} r$

2.2.3 Semantics of Formulae

The semantics of formulae is defined with respect to a finite/infinite word over $\Sigma$, a valuation $\gamma$ of the local variables and a set $Z \subseteq \mathcal{V}$ of local variables. The role of Z is to support scoping, exactly as in tight satisfaction. The role of $\gamma$ is to supply a current valuation of the local variables.

To connect to the semantics of $RE^{+V}$s which uses extended words to those of formulas which use only initial valuation of local variables, we make use of the notion of *enhancement*. An extended word w enhances $w$ with respect to $\gamma$, denoted $w \sqsupset \langle w, \gamma \rangle$, if $w|_\sigma = w$, w is good, and $\gamma$ is the starting pre-value, i.e. $w^0|_\gamma = \gamma$. The semantic of formulas using $RE^{+V}$s involves quantification over the enhancing words. The quantification follows that of PSL without local variables.

<u>Definition 7 (Satisfaction)</u>: *The notation $\langle w, \gamma \rangle \models_z \varphi$ means that the word w satisfies $\varphi$ with respect to controlled variables $Z \subseteq \mathcal{V}$ and current valuation of variables $\gamma$.*

- $\langle w, \gamma \rangle \models_z r!$ $\iff$ $\exists w \sqsupset \langle w, \gamma \rangle \text{ and } j < |w|\, s.t.\, w^{0..j} \models_z r$
- $\langle w, \gamma \rangle \models_z \neg \varphi$ $\iff$ $\langle w, \gamma \rangle \not\models_z \varphi$
- $\langle w, \gamma \rangle \models_z \varphi \wedge \psi$ $\iff$ $\langle w, \gamma \rangle \models_z \varphi \text{ and } \langle w, \gamma \rangle \models_z \psi$
- $\langle w, \gamma \rangle \models_z next!\, \varphi$ $\iff$ $|w| > 1 \text{ and } \langle w^{1..}, \gamma \rangle \models_z \varphi$
- $\langle w, \gamma \rangle \models_z \varphi\, until!\, \psi$ $\iff$ $\exists i < |w|, \langle w^{i..}, \gamma \rangle \models_z \psi \text{ and } \forall j < i, \langle w^{j..}, \gamma \rangle \models_z \varphi$
- $\langle w, \gamma \rangle \models_z r \mapsto \varphi$ $\iff$ $\forall w \sqsupset \langle w, \gamma \rangle \text{ and } j < |w| : if\, w^{0..j} \models_z r \text{ then}$
  $\langle w^{j+1..}, w^{j+1}|_\gamma \rangle \models_z \varphi$

- $\langle w, \gamma \rangle \vDash_z (new(X)\, \varphi) \iff \langle w, \gamma \rangle \vDash_{z \cup X} \varphi$
- $\langle w, \gamma \rangle \vDash_z (new(X := E)\, \varphi) \iff \langle w, [X := E](w^0, \gamma) \rangle \vDash_{z \cup X} \varphi$
- $\langle w, \gamma \rangle \vDash_z (free(X)\, \varphi) \iff \langle w, \gamma \rangle \vDash_{z \setminus X} \varphi$ Definition 8 (The Verification Problem): Let $\mathcal{M}$ be a set of words over $\Sigma$ and $\gamma_0$ an initial context of local variables. Let $\varphi$ be a $PSL^{+V}$ property and Z a set of local variables. We say that $\mathcal{M}$ satisfies $\varphi$ with respect to $\gamma_0$ and Z if for every word $w \in \mathcal{M}$, we have that $(\langle w, \gamma_0 \rangle \mid=_z \varphi$. The verification problem is to check whether for all words $\mathcal{M}$ satisfies $\varphi$ with respect to $\gamma_0$ and Z.

3. A Practical Subset of $PSL^{+V}$

The subset of PSL formulas with local variables which does not increase the complexity of the verification problem, is formally defined as follows.

Definition 9 (The Practical Subset of Formulae): Let $b \in \mathcal{B}$ be a Boolean expression. Let X be a sequence of local variables and E a sequence of expressions of the same length as X. The grammar below defines the formulae $\varphi$ that compose the practical subset, denoted $PSL^{pract}$:

$r ::= b \mid r \cdot r \mid r \cup r \mid r^+$ $R ::= b \mid (b, X := E) \mid R \cdot R \mid R \cup R \mid R^+ \mid (new(X)\, R) \mid (new(X := E)\, R) \mid (free(X)\, R)$ $\psi ::= r! \mid \neg r! \mid \psi \vee \psi \mid \psi \wedge \psi \mid next!\, \psi \mid \psi\, until!\, \psi \mid \psi\, releases\, \psi \mid r \mapsto \psi$ $\varphi ::= \neg R! \mid \psi \mid \varphi \vee \varphi \mid \varphi \wedge \varphi \mid next!\, \varphi \mid \varphi\, until!\, \psi \mid \psi\, releases\, \varphi \mid$
$\qquad R \mapsto \psi \mid (new(X)\, \varphi) \mid (new(X := E)\, \varphi) \mid (free(X)\, \varphi)$ Given a set $Q$ we use $\mathcal{B}(Q)$ to denote the set of monotone Boolean expressions over $Q$, i.e. the set of expressions composed by applying disjunction and conjunction to elements in $Q$. For instance, let $Q = \{q_1, q_2, \ldots, q_n\}$ then $(q_1 \wedge (q_2 \vee q_7)) \in \mathcal{B}^+(Q)$. We use $supp(\cdot)$ to denote the support of an expression in $\mathcal{B}^+(Q)$. For instance, $supp((q_1 \wedge (q_2 \vee q_7))) = \{q_1, q_2, q_7\}$.

Definition 10: A Local Variable Enhanced Alternating word automaton over finite/infinite words defined with respect to atomic propositions $\mathcal{P}$, local variables $\mathcal{V}$ is a tuple $\mathcal{A} = \langle Z, \Lambda, Q, I\ \rho, F, A \rangle$, where

- $Z$ is the set of local variables under control,

- $\Lambda$ is the extended alphabet as defined in Section 2.2,

- $Q$ is a finite and non-empty set of states,

- $I \in \mathcal{B}^+(Q)$ is a monotone Boolean expression describing the initial configuration of active states,

- $\rho : Q \times \Lambda \to \mathcal{B}^+(Q) \times \mathcal{U}$ gives the transition relation of states and local variables, where $\mathcal{U}$ are assignments to local variables as defined in Section 2.1. As an example, the transition below $$\rho(q_1, a) = \langle (q_2 \vee q_3) \wedge q_4, (x_1 := 2, x_2 := x_1 + 2, x_1 := 3) \rangle$$

says that under $a$, $q_1$ conveys its activeness to either $q_2$ and $q_4$, or $q_3$ and $q_4$. And the transition will assign 3 to $x_1$, and 4 to $x_2$. We call $\{q_2, q_4\}$ and $\{q_3, q_4\}$ the *existential* branches of $q_1$. Within $\{q_2, q_4\}$, $q_2$ and $q_4$ make a *universal* branch of $q_1$.

- $F \subseteq Q$ is a subset of states for accepting finite words.

- $A \subseteq Q$ is a *subset* of states for accepting infinite words (the Büchi condition).

If $A$ is not empty then $\mathcal{A}$ is termed an alternating Büchi word automaton. If $\mathcal{A}$ is empty then we call $\mathcal{A}$ an alternating finite word automaton. If there are no universal branches in all its transitions, the automaton is non-deterministic. If there are no local variables updates, i.e. $\rho : Q \times \Lambda \to \mathcal{B}^+(Q)$ we get a traditional alternating word automaton.

A run of a non-deterministic automaton $\mathcal{N}$ over a word is a sequence of states. A run on a finite word is accepting if it ends in a state in $F$. A run on an infinite words is accepting if a state in $A$ is visited infinitely often. A word $\mathbf{w}$ is accepted provided there is an accepting run on it.

A run of an alternating automaton $\mathcal{A}$ on $\mathbf{w} \in \Lambda$ is a labeled tree $\langle T, \tau \rangle$ where $T$ is a prefix closed subset of $\mathbb{N}^*$ and $\tau$ a mapping from a node $t \in T$ to a state in $Q$. We use $|t|$ to denote the depth of node $t$ in the tree $T$. The root of a tree is $\epsilon$. The depth of the root $|\epsilon|$ is 0. We use $succ(t)$ to denote the successors of node $t$, namely the nodes $t' \in T$ such that $t' = t \cdot n$ for some $n \in \mathbb{N}$. By abuse of notations, if $succ(t) = \{t_1, \ldots, t_m\}$ we say that $\{\tau(t_1), \ldots, \tau(t_m)\}$ are the successors of state $\tau(t)$.

A labeled tree $\langle T, \tau \rangle$ is a *consistent run* of $\mathcal{A}$ on a good extended word $\mathbf{w} \in \Lambda$ and initial context $\gamma_0 \in \Gamma$ if the following three conditions hold: (a) the initial states satisfy the automaton initial condition and the initial word pre-value is $\gamma_0$, formally, $\tau(succ(\epsilon)) \models I$ and $\mathbf{w}^0|_\gamma = \gamma_0$ and (b) the successors of a state $t$ satisfy the transition relation with respect to $\tau(t)$ and $\mathbf{w}^{|t|}$ and (c) the post-valuation of local variables agrees with the transition's update. Formally, let $t \neq \epsilon$ be a node in $T$ such that $\tau(t) = q$ and $\rho(q, \mathbf{w}^{|t|-1}) = \langle b, U \rangle$, then for the tree to be a consistent run we should have $\tau(succ(t)) \models b$ and $\mathbf{w}^{|t|-1}|_{\gamma'} \stackrel{z}{=} [\![U]\!](\mathbf{w}^{|t|-1}|_{\sigma\gamma})$.

The universal branches (conjunction) in the transition relation are reflected in the successor relation of $\langle T, \tau \rangle$. The existential branches (disjunction) are reflected in the fact that one may have multiple runs of $\mathcal{A}$ on $\mathbf{w}$. After a universal branch, all active successors, namely $succ(t)$, further propagate the activeness to their successors. A run $\langle T, \tau \rangle$ is *accepting* provided all paths satisfy the acceptance condition (i.e. terminate in a state in $F$ if the path is finite, and visit infinitely often a state in $A$ if the path is infinite). A word $\mathbf{w}$ is accepted by $\mathcal{A}$ if there exists an accepting run on it. The language of $\mathcal{A}$, denoted by $\mathcal{L}(\mathcal{A})$ is the set of words accepted by $\mathcal{A}$.

The method to prove that a property $\varphi$ is valid in a model $\mathcal{M}$ by the automata-theoretic approach is to build an alternating automaton $\mathcal{A}_{\neg\varphi}$ that accepts the same language as $\neg\varphi$, namely $\mathcal{L}(\neg\varphi)$, then build the product (a.k.a. parallel composition) $\mathcal{M} \parallel \mathcal{A}_{\neg\varphi}$ and prove the language of the product automaton is empty.

Intuitively, the increase in complexity of the verification problem from PSPACE to EXPSPACE in the presence of local variables stems from the fact that the automaton needs to track all possible values a local variable may obtain. If a formula has $k$ local variables over domain $\mathcal{D}$, the automaton should, in general, track all possible $\mathcal{D}^k$ values they may obtain. The practical subsets tries to detect formulas for which the worst case will not be met. For instance, consider formula $\varphi_1$ from Example 4, intuitively the automaton should track just one value of the local variable $x$ per each run (the value of *data_in*) when *start* rises.

The situation with $\varphi_2$ and $\varphi_3$ from Example 5 is more intricate. Here $x$ may change unboundedly many times throughout the evaluation of the formula. But that in itself is not a problem – different automaton states will record different value of $x$. The problem is that transactions may overlap, i.e. *start* may hold at cycles $k_1 < k_2$ where *end* does not hold in any cycle $k_1 \leq j \leq k_2$. Thus the automaton should track several possibilities for $x$ on the same position of the same word! Think, for example, on the word $\langle start \rangle \langle put \rangle \langle \, \rangle \langle put \rangle \langle put \rangle \langle start \rangle \langle put \rangle \langle \, \rangle$ .... The value of $x$ on the 8-th letter should be 4 for the first transaction but 1 for the second. However, there is an important difference between $\varphi_2$ and $\varphi_3$. To refute $\varphi_2$ it suffices to track the change on just one transaction whereas to refute $\varphi_3$ one needs to track all transaction.

Tracking different values for same position of the word means that a run tree of the automaton may have a node with two decedents that disagree on the value of the local variables. We call an automaton in which such a situation cannot occur conflict free. The automaton for $\varphi_2$ will be conflict-free but the one for $\varphi_3$ will not be.

Definition 11 (Conflict Free Automata): We say that a run $\langle T, \tau \rangle$ on $w$ is conflict-free if there exists no pair of distinct nodes $t_1, t_2 \in T$ of same depth $i = |t_1| = |t_2|$ such that $\rho(\tau(t_1), w^i) = \langle b_1, X_1 := E_1 \rangle$ and there exists a node $t'_2 \in T$ such that $t'_2$ is a descendent of $t_2$ and $\rho(\tau(t'_2), w^i) = \langle b_2, X_2 := E_2 \rangle$ where there exists a local variable $z \in X_1 \cap X_2$. We say that $\mathcal{A}$ is conflict-free if every run of it is conflict-free.

Lemma 12 (Automata Construction for $RE^{+V}$): Let r be an $RE^{+V}$, and $Z \subseteq \mathcal{V}$. There exists a conflict-free non-deterministic finite automaton $\mathcal{N}(r)$ with $O(|r|)$ states that accept exactly the set of words $w$ such that $w \models_z r$.

Proof: See Section 4.

Lemma 13 (Automata Construction for the Practical Subset): Let $\varphi$ be a formula in $PSL^{pract}$, $Z \subseteq \mathcal{V}$ a set of controlled variables, and $\gamma \in \Gamma$ an initial value for local variables. There exists a conflict-free local variable enhanced alternating word automaton $\mathcal{A}_{\gamma,z}(\neg \varphi)$ with number of states $O(|\varphi|)$ and of size $|\mathcal{A}_{\gamma,z}(\neg \varphi)| = O(|\varphi|)$ that accept exactly the set of words w such that $\langle w, \gamma \rangle \models_z \neg \varphi$ Proof Sketch. In Section 4, we provide a construction for properties whose negation is in $PSL^{pract}$. Since the subset does not support the negation operator we need to propagate it down to $RE^{+V}$s using the duality between operators, as provided at the end of Definition 3. Note that for *next!*, *free*( ) and *new*( ) negation just propagates as is (that is, they are dual to themselves). Hence we end up with a property $\varphi$ in the following set $r ::= b \mid r \cdot r \mid r \cup r \mid r^+$ $R ::= b \mid (b, X := E) \mid R \cdot R \mid R \cup R \mid R^+ \mid (new(X)R) \mid$
$(new(X := E) R) \mid (free(X) R)$ $\psi ::= \neg r! \mid r! \mid \psi \vee \psi \mid \psi \wedge \psi \mid next! \ \psi \mid \psi \ until! \ \psi \mid \psi \ releases \ \psi \mid r \circ$
$\quad =\Diamond \ \psi$ $\varphi ::= R! \mid \psi \mid \varphi \vee \varphi \mid \varphi \wedge \varphi \mid next! \ \varphi \mid \varphi \ releases \ \psi \mid \psi \ until! \ \varphi \mid R \circ$
$\quad =\Diamond \ \psi \mid$
$(new(X) \ \varphi) \mid (new(X := E) \ \varphi) \mid (free(X) \ \varphi)$ Following the construction in Section 4 we see that the only universal branches introduced are the ones dealing with $\wedge$, *until!* and *releases*. For $\wedge$ we create distinct copies of the local variables, and for *until!* and *releases*, since $\psi$ does not contain assignments, the automaton is conflict-free.

We now show that given a conflict-free alternating automaton we can extract the part dealing with local variables to a *satellite* — a machine determining the value of local variables by observing the states of the automaton and the values of atomic propositions and local variables.

Definition 14 (A Satellite): Let $\mathcal{B}$ be an alternating automaton with state set Q, an initial value of local variables $\gamma_0 \in \Gamma$ and a set of local variables $Z \subseteq \mathcal{V}$. A satellite S with respect to $\mathcal{B}$, Z and $\gamma_0$ is a set of pairs of the form (g, U) whose first element g is a Boolean expression over $\mathcal{P}, \mathcal{V}$ and Q; and its second element $U \in \mathcal{U}$ is a local variable update.

Intuitively, $g$ is a condition (guard) upon which the assignments in U take place. Formally, let $\mathcal{B}$ be an alternating automaton over extended words, $S$ a satellite as above, and $\mathbf{v}$ be an extended good word. We say that a run tree $\langle T, \tau \rangle$ of $\mathcal{B}$ on $\mathbf{v}$ is consistent with $S$ if the following two conditions hold. First, the initial context agrees with $\gamma_0$, that is $\mathbf{v}^0|_\gamma = \gamma_0$. Second, for every node $t \in T$ $with$ $|t| = i$ and $\tau(t) = q$, and every local variable $z \in Z$ if there is no pair $\langle g, X := E \rangle \in S$ such that $z \in X$ and $g(\mathbf{v}^i|_{\sigma\gamma\prime}, q) = T$ then $z(\mathbf{v}^i|_{\gamma\prime}) = (\mathbf{v}^i|_\gamma)$, otherwise (a) there exists no other pair $(g', X' := E') \in S$ with $z \in E'$ and $g'(\mathbf{v}^i|_{\sigma\gamma\prime}, q) = T$ and (b) the word is consistent with respect to the update of $z$, that is, $z(\mathbf{v}^i|_{\gamma\prime}) = z([\![X := E]\!](\mathbf{v}^i|_{\sigma\gamma}))$.

We refer to $\mathcal{B} \parallel S$ as the parallel run of $S$ $and$ $\mathcal{B}$, and use $\mathcal{L}(\mathcal{B} \parallel S)$ to denote the set of words w such that there exists a run of $\mathcal{B}$ on w which is consistent with $S$.

Lemma 15 (Satellite Extraction): Given a conflict-free local variable-enhanced alternating word automaton $\mathcal{A}_{\gamma,z}$, there exist an alternating Büchi automaton $\mathcal{B}_z$ and a satellite $S_{\gamma,z}$, with respect to $\mathcal{B}_z$ such that $|\mathcal{B}_z| + |S_{\gamma,z}| = O(|\mathcal{A}_{\gamma,z}|)$ and $\mathcal{L}(\mathcal{A}_{\gamma,z}) = \mathcal{L}(\mathcal{B}_z \parallel S_{\gamma,z})$.

Proof: See Section 4.

The proof of our main theorem follows from the above three lemmas.

PROOF SKETCH OF THEOREM 1

Given a model $\mathcal{M}$ of words (typically described as a hardware design), and a formula $\varphi$ of $PSL^{pract}$, we check whether $\mathcal{M}$ satisfies $\varphi$ as follows. Assume $\gamma \in \Gamma$ is an initial value for the local variables and Z are the variables assigned in $\varphi$. By Lemma 13 there exists a conflict-free local variable-enhanced alternating word automaton $\mathcal{A}_{\gamma,z}$ of size $O(|\varphi|)$ such that $\mathcal{L}(\mathcal{A}_{\gamma,z}) = \mathcal{L}(\neg\varphi)$.

By Lemma 15 we can construct a traditional alternating Büchi automaton $\mathcal{B}_z$ with $O(|\varphi|)$ states, and a satellite $S_{\gamma,z}$ over $\mathcal{B}_z$ of size $O(|\varphi| \times |Z|)$ such that $\mathcal{L}(S_{\gamma,z} \| \mathcal{B}_z) = \mathcal{L}(\neg\varphi)$. Since $\mathcal{B}_z$ is a traditional automaton we can apply the Miyano-Hayashi construction to it to get a non-deterministic automaton $\mathcal{N}$ whose number of states is exponential in $|\varphi|$, and is representable in $O(|\varphi|)$ space, and accepts the same language as $\mathcal{B}_z$. Thus, $\mathcal{L}(S_{\gamma,\emptyset} \| \mathcal{N}) = \mathcal{L}(\neg\varphi)$.

It follows then that $\mathcal{L}(\mathcal{M} \| S_{\gamma,\emptyset} \| \mathcal{N}) = \mathcal{M} \cap \mathcal{L}(\neg\varphi)$. Thus the complexity of checking whether $\mathcal{M} \models \varphi$ reduces to the non-emptiness of non-deterministic automata with number of states polynomial in $|\mathcal{M}|$ and exponential $|\varphi|$. Non-emptiness of non-deterministic automata is NLOGSPACE-Complete with respect to their size. Thus our problem can be solved in space polynomial in $|\varphi|$ and logarithmic in $|\mathcal{M}|$.

We can check satisfability of $\text{PSL}^{pract}$ formulas, similarly — by checking the emptiness of $S_{\gamma,\emptyset} \| \mathcal{N}$. Thus, similar arguments show that satisfaiblity of $\text{PSL}^{pract}$ can as well be checked in space polynomial in $|\varphi|$.

4. AUTOMATA CONSTRUCTION AND PROOFS 4.1 PROOF OF CONSTRUCTION FOR $\text{RE}^{+V}$s Proof of Lemma 12: We provide a construction of $\mathcal{N}(r)$ and then claim its correctness. For the inductive steps we assume $\mathcal{N}(r_i) = \langle Z_i, \Lambda, Q_i, I_i, \rho_i, F_i, \emptyset \rangle$ satisfy the lemma.

- $\mathcal{N}(b) = \langle \emptyset, \Lambda \{q_0, q_{ACC}\}, q_0, \rho, q_{ACC}, \emptyset \rangle$, where $$\rho(q_0, a) = \begin{cases} \langle q_{ACC}, \varepsilon \rangle & \text{if } b(a) = true \\ \langle false, \varepsilon \rangle & \text{otherwise} \end{cases}$$

- $\mathcal{N}(b, X := E) = \langle X, \Lambda, \{q_0, q_{ACC}\}, q_0, \rho, q_{ACC}, \emptyset \rangle, =$ where $$\rho(q_0, a) = \begin{cases} \langle q_{ACC}, X := E \rangle & \text{if } b(a) = true \\ \langle false, \varepsilon \rangle & \text{otherwise} \end{cases}$$

- $\mathcal{N}(\lambda) = \langle \emptyset, \Lambda, \{q_{ACC}\}, q_{ACC}, \emptyset, q_{ACC}, \emptyset \rangle$

- $\mathcal{N}(r_1 \cup r_2) = \langle Z_1 \cup Z_2, \Lambda, Q_1 \cup Q_2, I_1 \vee I_2, \rho_1' \cup \rho_2', F_1 \cup F_2, \emptyset \rangle$ where $$\rho_1'(q, a) = \begin{cases} \rho_1(q, a) & \text{if } a \text{ preserves } Z_2 \setminus Z_1 \\ (false, \varepsilon) & \text{otherwise} \end{cases}$$

$$\rho_2'(q, a) = \begin{cases} \rho_2(q, a) & \text{if } a \text{ preserves } Z_1 \setminus Z_2 \\ (false, \varepsilon) & \text{otherwise} \end{cases}$$

- $\mathcal{N}(r_1 \cdot r_2) = \langle Z_1 \cup Z_2, \Lambda, Q_1 \cup Q_2, I_1, \rho_1' \cup \rho_2', F_2, \emptyset \rangle$ where $$\rho_2'(q, a) = \begin{cases} \rho_2(q, a) & \text{if } a \text{ preserves } Z_1 \setminus Z_2 \\ (false, \varepsilon) & \text{otherwise} \end{cases}$$

$$\rho_1'(q, a) = \begin{cases} \langle S_1 \vee I_2, U \rangle & \text{if } \rho_1(q, a) = \langle S_1, U \rangle \text{ and } F_1 \cap S_1 \neq \emptyset \text{ and } a \text{ preserves } Z_2 \setminus Z_1 \\ \langle S_1, U \rangle & \text{if } \rho_1(q, a) = \langle S_1, U \rangle \text{ and } F_1 \cap S_1 \neq \emptyset \text{ and } a \text{ preserves } Z_2 \setminus Z_1 \\ (false, \varepsilon) & \text{otherwise} \end{cases}$$

- $\mathcal{N}(r_1^+) = \langle Z_1, Q_1, I_1, \rho_1', F_1, \emptyset \rangle$, where $$\rho_1'(q, a) = \begin{cases} \langle S_1 \vee I_2, U \rangle & \text{if } \rho_1(q, a) = \langle S_1, U \rangle \text{ and } F_1 \cap S_1 \neq \emptyset \\ \langle S_1, U \rangle & \text{if } \rho_1(q, a) = \langle S_1, U \rangle \text{ and } F_1 \cap S_1 \neq \emptyset \end{cases}$$

- $\mathcal{N}(\text{new } (X) r_1) = \langle Z_1 \cup X, \Lambda, Q_1, I_1, \rho_1, F_1, \emptyset \rangle$

- $\mathcal{N}(\text{new } (X := E) r_1) = \langle Z_1 \cup X, \Lambda, Q_1 \cup S', S', \rho \cup \rho', F_1, \emptyset \rangle$ where
    - $S' = \{q' \mid q \in supp(I_1)\}$
    - $\rho'(q', a) = \langle b, (X := E) \cdot U \rangle$ assuming $q \in \rho(q, a) = \langle b, U \rangle$

- $\mathcal{N}(\text{free } (X) r_1) = \langle Z_1 \setminus X, \Lambda, Q_1, I_1, \rho_1, F_1, \emptyset \rangle$ The conflict-freeness of $\mathcal{N}$ follows trivially from the absence of universal branches in the transitions. For language acceptance, the cases $\lambda, b, r_1 \cdot r_2, r_1^+$ and $r_1 \cup r_2$ follow the traditional construction with the desired adjustment for the set of local variables. In the cases (new(X) $r_1$) and (free(X) $r_1$), there are changes to Z, but no changes in the transition and the acceptance condition. The case of (new(X := E) $r_1$) is a bit more intricate, but follows quite directly from the definition of the semantics.

4.2 Proof of Construction for Properties of the Practical Subset

Proof of Lemma 13. For the inductive steps we assume for the operands $\varphi_1, \varphi_2, \psi_1, \psi_2, r_1, R_1$ the automata $\mathcal{A}_\gamma(\phi_i) = \langle Z_i, \Lambda, Q_i, I_i, \rho_i, F_i, A_i \rangle$ satisfy the inductive hypothesis (with $\phi \in \{r, R, \varphi, \psi\}$ and $i \in \{1,2\}$). Let $U$ be a sequence of assignments to local variables in $Z$. Let $X \subseteq Z$ and let $X'$ be a set of fresh variables of same size as $|X|$. We use $U[X \leftarrow X']$ to denote the sequence of assignments $X' := X \cdot U'$ where $U'$ is obtained from $U$ by replacing all occurrences of variables in $X$ with the respective variable in $X'$. For a tuple $\langle b, U \rangle$, we use $\langle b, U \rangle [X \leftarrow X']$ to denote $\langle b, U [X \leftarrow X'] \rangle$.

- $\mathcal{A}(R_1!) = \langle Z_1, \Lambda, Q_1 \cup \{q_{ACC}\}, I_1, \rho'_1, F_1, \{q_{ACC}\}\rangle$, where $$\rho'_1(q, a) = \begin{cases} \langle q_{ACC}, \varepsilon \rangle & \text{if } q = q_{ACC} \\ \langle S_1, U \rangle & \text{else if } \rho_1(q, a) = \langle S_1, U \rangle \text{ and } F_1 \cap S_1 = \emptyset \\ \langle S_1 \vee q_{ACC}, U \rangle & \text{else if } \rho_1(q, a) = \langle S_1, U \rangle \text{ and } F_1 \cap S_1 \neq \emptyset \end{cases}$$

- $\mathcal{A}(\neg r_1!) = \langle Z_1, \Lambda, Q_1 \cup \{q_{REJ}\}, \bar{I}_1, \rho'_1, \{q_{REJ}\}, \{q_{REJ}\}\rangle$ Let $b$ be a monotone Boolean expression. We use $\bar{b}$ to denote the Boolean expression obtained from $b$ by replacing $\vee$ with $\wedge$ and vice versa. Let $Q$ be a finite set $\{q_1, \ldots, q_n\}$. We use $\bar{Q}$ to denote $q_1 \wedge \cdots \wedge q_n$.

$$\rho'_1(q, a) = \begin{cases} \langle q_{REJ}, \varepsilon \rangle & \text{if } q = q_{REJ} \\ \langle q_{REJ}, \varepsilon \rangle & \text{else if } \rho_1(q, a) = \langle false, \varepsilon \rangle \\ \langle \bar{S}_1, U \rangle & \text{otherwise if } \rho_1(q, a) = \langle S_1, U \rangle \end{cases}$$

- $\mathcal{A}(\varphi_1 \vee \varphi_2) = \langle Z_1 \cup Z_2, \Lambda, Q_1 \cup Q_2, I_1 \vee I_2, \rho', F_1 \cup F_2, A_1 \cup A_2 \rangle$ where $$\rho'_1(q, a) = \begin{cases} \rho_1(q, a) & \text{if } q \in Q_1 \text{ and } a \text{ preserves } Z_2 \setminus Z_1 \\ \rho_2(q, a) & \text{if } q \in Q_2 \text{ and } a \text{ preserves } Z_1 \setminus Z_2 \end{cases}$$

- $\mathcal{A}(\varphi_1 \wedge \varphi_2) = \langle Z', \Lambda, Q_1 \cup Q_2, I_1 \vee I_2, \rho', F_1 \cup F_2, A_1 \cup A_2 \rangle$ Let $X = Z_1 \cap Z_2$, $Y_1 = Z_1 \setminus Z_2$, $Y_2 = Z_2 \setminus Z_1$. Let $X_1, X_2$ be fresh vectors of variables of same size as $X$.

- $Z' = X_1 \cup Y_1 \cup X_2 \cup Y_2$.

- $\rho'(q, a) = \begin{cases} \rho_1(q, a)[X \leftarrow X_1] & \text{if } q \in Q_1 \text{ and } a \text{ preserves } Z_2 \setminus Z_1 \\ \rho_1(q, a)[X \leftarrow X_2] & \text{if } q \in Q_2 \text{ and } a \text{ preserves } Z_1 \setminus Z_2 \end{cases}$

- $\mathcal{A}(next!\,\varphi_1) = \langle Z_1, \Lambda, Q_1 \cup \{q_0\}, q_0, \rho_1 \cup \rho', F_1, A_1 \rangle$, where
  $\rho'_1(q_0, a) = \langle l_1, \varepsilon \rangle$ for every $a \in \Lambda$

- $\mathcal{A}(\psi_1\ until!\ \varphi_2) = \langle Z', \Lambda, Q_1 \cup Q_2 \cup \{q_0\}, l_2 \vee (l_2 \vee q_0), \rho, F_1 \cup F_2, A_1 \cup A_2 \rangle$
  Let $X = Z_1 \cap Z_2$, $Y_1 = Z_1 \setminus Z_2$, $Y_2 = Z_2 \setminus Z_1$. Let $X_1, X_2$ be fresh vectors of variables of same size as X.
  - $Z' = X_1 \cup Y_1 \cup X_2 \cup Y_2$.
  - $\rho'(q, a) = \begin{cases} \langle l_2 \vee (l_1 \wedge q_0), \varepsilon \rangle & \text{if } q \text{ is } q_0 \\ \rho_1(q, a)[X \leftarrow X_1] & \text{if } q \in Q_1 \text{ and } a\ preserves\ Z_2 \setminus Z_1 \\ \rho_2(q, a)[X \leftarrow X_2] & \text{if } q \in Q_2 \text{ and } a\ preserves\ Z_1 \setminus Z_2 \end{cases}$

- $\mathcal{A}(\varphi_1\ releases\ \psi_2) = \langle Z', \Lambda, Q_1 \cup Q_2 \cup \{q_0\}, l_2 \vee (l_2 \vee q_0), \rho, F_1 \cup F_2, A_1 \cup A_2 \rangle$
  Let $X = Z_1 \cap Z_2$, $Y_1 = Z_1 \setminus Z_2$, $Y_2 = Z_2 \setminus Z_1$. Let $X_1, X_2$ be fresh vectors of variables of same size as X.
  - $Z' = X_1 \cup Y_1 \cup X_2 \cup Y_2$.
  - $\rho(q, a) = \begin{cases} \langle l_2 \vee (l_1 \wedge q_0), \varepsilon \rangle & \text{if } q \text{ is } q_0 \\ \rho_1(q, a)[X \leftarrow X_1] & \text{if } q \in Q_1 \text{ and } a\ preserves\ Z_2 \setminus Z_1 \\ \rho_2(q, a)[X \leftarrow X_2] & \text{if } q \in Q_2 \text{ and } a\ preserves\ Z_1 \setminus Z_2 \end{cases}$

- $\mathcal{A}(r_1 \circ = \diamond\ \varphi_2) = \langle Z_1 \cup Z_2, \Lambda, Q_1 \cup Q_2, l_1, \rho', F_2, A_2 \rangle$, where
  $\rho'(q, a) = \begin{cases} \langle b \vee l_2, U \rangle & \text{if } q \in Q_1 \text{ and } a \text{ preserves } Z_2 \setminus Z_1 \text{ and} \\ & \rho_1(q, a) = \langle b, U \rangle \text{ and } F_1 \cap supp(b) \neq \emptyset \\ \rho_1(q, a) & \text{otherwise if } q \in Q_1 \text{ and } a \text{ preserves } Z_2 \setminus Z_1 \\ \rho_2(q, a) & \text{if } q \in Q_2 \text{ and } a \text{ preserves } Z_1 \setminus Z_2 \end{cases}$

- $\mathcal{A}(new(X)\ \varphi_1) = \langle Z_1 \cup X, \Lambda, Q_1, l_1, \rho_1, F_1, A_1 \rangle$

- $\mathcal{A}(new\ (X := E)\ \varphi_1) = \langle Z_1 \cup X, \Lambda, Q_1, \cup S', S', \rho \cup \rho', F_1, A_1 \rangle$, where
  - $S' = \{q' \mid q \in supp(l_1)\}$
  - $\rho'(q', a) = \langle b, (X := E) \cdot U \rangle$ assuming $q \in \rho(q, a) = \langle b, U \rangle$

- $\mathcal{A}(free(X)\ \varphi_1) = \langle Z_1 \setminus X, \Lambda, Q_1, l_1, \rho_1, F_1, A_1 \rangle$ We now have to show that $\mathcal{A}(\varphi)$ as constructed satisfies the premises of the lemma. It is easy to see that $\mathcal{A}(\varphi)$ is polynomial in $|\varphi|$. The proof that it accepts the same language as $\varphi$ follows the one for traditional constructions. It is left to show that it is conflict-free.

To see that it is conflict free we observe that a universal quantification is introduced in the following cases $\neg r!$, $\wedge$, *until!* , *releases*. For the case of $\neg r!$ the syntax restrictions on $r$ guarantees that $r$ has no assignments, thus there are no updates in the generated automaton. For the case of $\wedge$ the construction introduces fresh variables for the operands, thus no conflict is met. For the constructions of the *until!* and *releases* operators, the introduction of fresh variables guarantees no conflict between the updates done by the two operands. It is left to see that no conflict can arise by the several instances corresponding to the operand $\varphi$ where updates of local variables is allowed. To see this note that in any run tree there will be only one layer where the successors of state $q_0$ (introduced in the construction for the cases of *until!* and *releases* ) are the initial states of $\mathcal{A}(\varphi)$. Hence, updates to the variables in $\varphi$ will be done at most once in every tree. For instance, for *releases* we have that $q_0$ transits to $I_2 \wedge (I_1 \vee q_0)$. That is, $q_0$ transits to either both $q_0$ and $I_2$ or to both $I_2$ and $I_1$. So once it has chosen to transit to both $I_2$ and $I_1$ there will be no further such transitions to $I_1$. Since local variables updates of $\varphi_1$ will occur at the sub-tree emerging from $I_1$ we get that there will be only one such updates per tree.

Thus in any run of $\mathcal{A}$ if there is a local variable update to a node $t$ at depth $i$ then any node $t'$ of same depth which is not a descendent of $t$ may not have a local variable assignment to the same variable. This is since $t$ and $t'$ emerge from different branches of a universal quantification, and as mentioned above, in all such cases variables of the different branches where renamed. Hence the automaton is conflict-free.

Example 16. Recall the formula $\varphi_1$ from Example 4. The construction for it is given in Sec 5.1. Recall the formula $\varphi_2$ and $\varphi_3$ from Example 5. The construction for $\varphi_2$ is given in Sec 5.2. The formula $\varphi_3$ is not in $PSL^{pract}$, therefore we cannot apply the construction to it. We do, however, show what the construction would have looked like for $\varphi_3$ as well, if the syntactic restrictions where relaxed to allow it, and negation of $RE^{-V}$ with local variable assignment was treated the same as for RE without local variable assignment.

Proof of Lemma 15: Let $\mathcal{A}_{\gamma_0} = \langle Z, \Lambda, Q, I, \rho, F, A \rangle$ be a conflict-free alternating Büchi automaton. We define a traditional alternating Büchi automaton $\mathcal{B}_z$ and a satellite $S_{\gamma_0,z}$ that satisfy the theorem as follows.

The automaton $\mathcal{B}_z$ is a traditional alternating automaton in the sense that his transitions maps to $\mathcal{B}^+(Q)$ but there are no updates of local variables associated with transitions. The automaton, does however, read the current value of local variables in its letters. It simply ignores the updates annotations of $A_{\gamma 0}$. Formally, $\mathcal{B}_Z = \langle \Sigma \times \Gamma, Q, I, \rho', F, A \rangle$ where $$\rho'(q', a) = b \quad \text{iff} \quad \rho(q, a) = \langle b, U \rangle \text{ for some } U \in \mathcal{U}$$

The satellite $S_{\gamma 0,z}$ is in-charge of making the correct updates of local variables. The definition of $S_{\gamma_0,z}$ follows the transition of $A_{\gamma 0}$ as follows. For every transition $\rho(q, a) = \langle b, U \rangle$ a pair $(g, U)$ is added to $S_{\gamma 0,z}$ where $g$ is defined as $q \wedge b$.

To prove that $\mathcal{B}_z$ and $S_{\gamma_0,z}$ satisfy the theorem, we show that every run of $\mathcal{A}_{\gamma 0}$ is a consistent run of $\mathcal{B}_z$ with respect to $S_{\gamma_0,z}$. Let $(T, \tau)$ be a run tree of $\mathcal{A}_{\gamma_0}$ on an extended word $w$ with initial context $\gamma_0$. We know that the initial pre-value of $w$ satisfy $\gamma_0$ and that the successors of the root satisfy the initial condition $I$ since these requirements are the same for runs of $\mathcal{A}_{\gamma 0}$ and $\mathcal{B}_z$.

To see that the second condition for a consistent run is met we note that since $\mathcal{A}_{\gamma 0,z}$ is context free we are guaranteed that on every run, if there is an update to a local variable $z$ at node $t$ and there is another node $t'$ of the same depth as $t$ then there are no updates to $z$ from $t'$ and any of its descendants. Thus, it cannot be that there are two pairs $(g_1, U_1)$ and $(g_2, U_2)$ such that both hold on a state $q$ and they update a common variable $z$. Therefore the update of a local variable $z$ will be done by the unique guard that holds at that node, if such a guard exits, and will remain the same otherwise. Therefore the second condition of a consistent run holds and $(T, \tau)$ is a consistent run of $\mathcal{B}_z$ with respect to $S_{\gamma_0,z}$.

The reasoning for the reversed direction is similar.

5. ADDITIONAL MATERIAL

5.1 CONSTRUCTION FOR $\varphi_1$, FROM EXAMPLE 4

Let $\{a, b, data\_in, data\_out\} \subseteq P$, and $x \in \mathcal{V}$. Let $$\varphi = always(((\neg start)^+ \cdot (start, x := data\_in)) \mapsto (\neg end)^+ \cdot end \wedge (data\_out = x))$$

We have $$\neg\varphi = eventually!\, ((\neg start)^+ \cdot (\neg start, x := data\_in)) \circ = \Diamond \neg((\neg end)^+ \cdot end \wedge (data\_out = x))$$

$$= true\, until!\, (((\neg start)^+ \cdot (\neg start, x := data\_in)) \circ = \Diamond \neg((\neg end)^+ \cdot end \wedge (data\_out = x)))$$

Figure 5A:
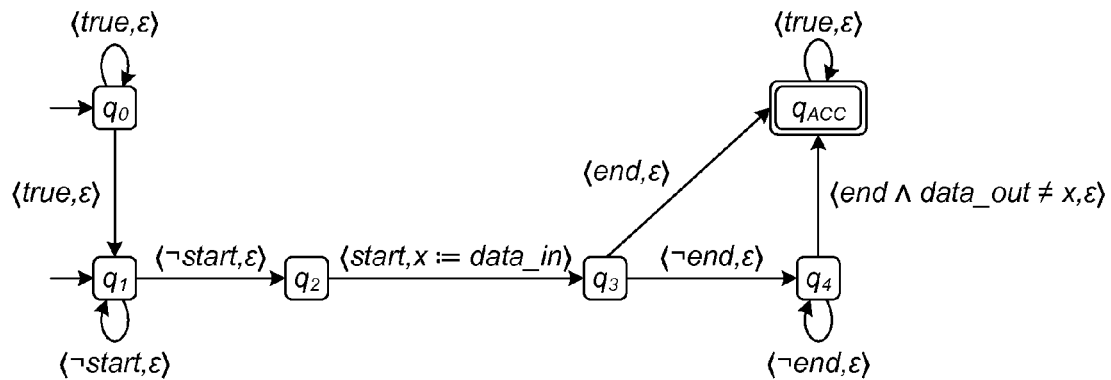
FIG. 5A illustrates an annotated alternating automaton for an exemplary temporal logic formula.

Then $\mathcal{A}_{\gamma_0}(\neg\varphi) = \langle Z, \Lambda, Q, q_0 \vee q_1, \rho, \{q_{ACC}\}, \{q_{ACC}\}\rangle$, where $Q = \{q_0, q_1, q_2, q_3, q_4, q_{ACC}\}$ and $\rho$ is illustrated in FIG. 5A. We can extract $\mathcal{B}_z(\neg\varphi)$ and $S_{\gamma_0, z}(\neg\varphi)$ from $\mathcal{A}_{\gamma_0}(\neg\varphi)$ as follows

Figure 5B:
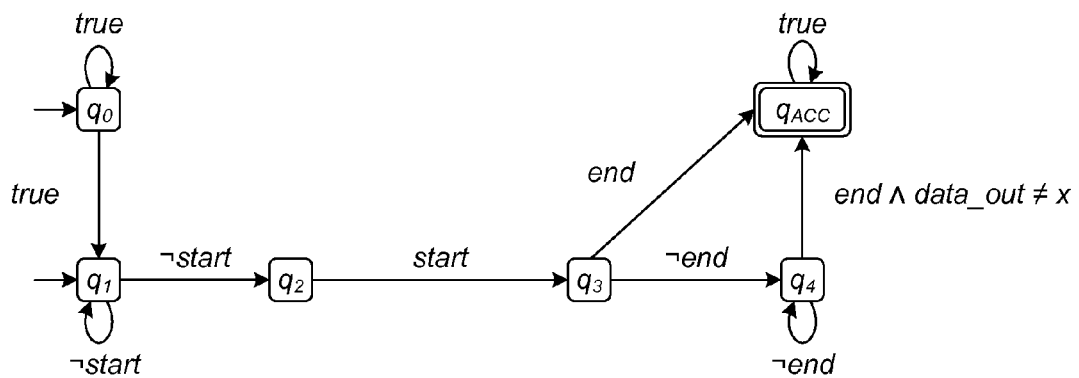
FIG. 5B illustrates an un-annotated non-deterministic automaton for the automaton of FIG. 5A.

- $\mathcal{B}_z = \langle \Sigma \times \Gamma, Q, q_0 \vee q_1, \rho', \{q_{ACC}\}, \{q_{ACC}\}\rangle$, where $\rho'$ is illustrated in FIG. 5B

- $S_{\gamma_0, z}(\neg\varphi) = \{\langle q_2 \wedge start, x := data\_in\rangle\}$

5.2 CONSTRUCTION FOR $\varphi_2$ AND $\varphi_3$ FROM EXAMPLE 5

For the construction of $\varphi_2$ and $\varphi_3$, let's define the sub regular expressions as follows.

Figure 6A:
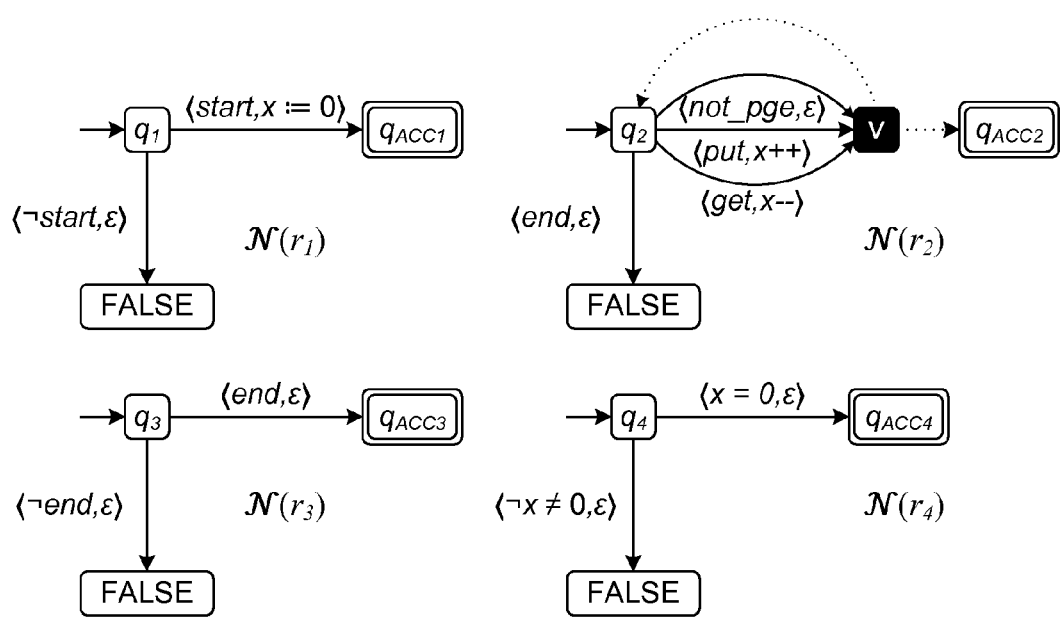
FIG. 6A illustrates four automata for sub regular expressions for a second and a third exemplary temporal logic formula.
Figure 6B:
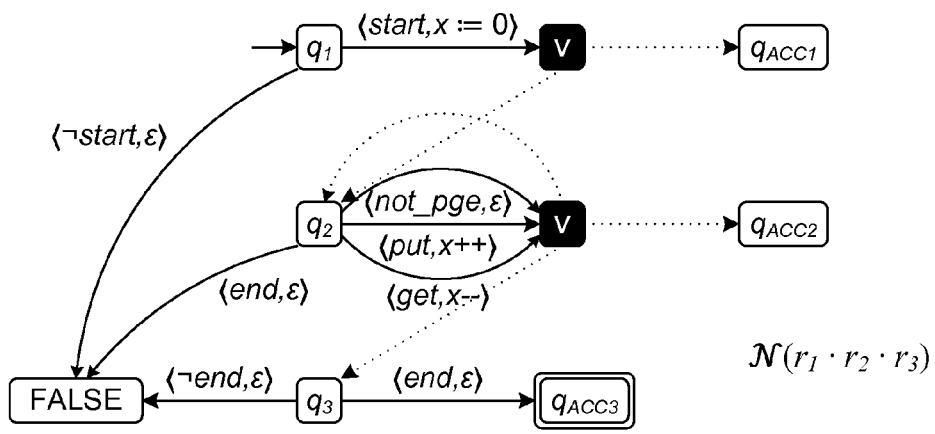
FIG. 6B illustrates an automaton after combining three automata from FIG. 6A, needed for the second exemplary temporal logic.

$r_1 =_{def} (start, x := 0)$ $r_2 =_{def} (not\_pge \cup (put, x++) \cup (get, x--))'$ $r_3 =_{def} end$ $r_4 =_{def} x = 0$ Therefore, $\varphi_2 = always\, (r_1 \cdot r_2 \cdot r_3 \mapsto r_4!)$ $\varphi_3 = always\, (r_1 \mapsto (r_2 \cdot r_3 \cdot r_4!))$ And consequently, we have $\neg\varphi_2 = eventually!\, (r_1 \cdot r_2 \cdot r_3 \circ = \Diamond \neg(r_4!))$ $\neg\varphi_3 = eventually!\, (r_1 \circ = \Diamond \neg(r_2 \cdot r_3 \cdot r_4)!)$ By Lemma 12 we have the automata of $r_1, r_2, r_3$ and $r_4$ as shown in FIG. 6A. Hence, for $r_1 \cdot r_2 \cdot r_3$, we obtain the automaton shown in FIG. 6B.

Figure 6C:
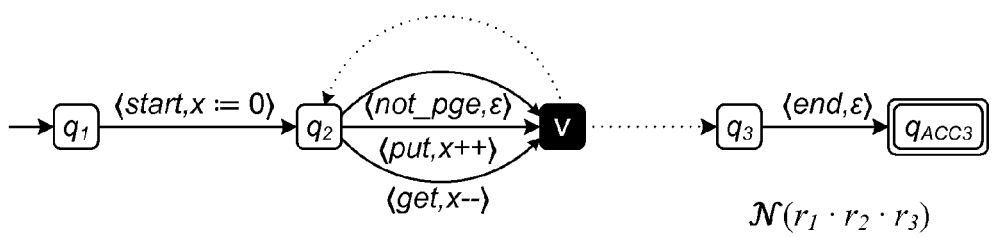
FIG. 6C illustrates an optimized automaton for the automaton illustrated in FIG. 6B.

The states $q_{ACC1}$, $q_{ACC2}$ and FALSE are redundant. But otherwise, we can optimize an automaton by removing non-accepting nodes if they do not have any outgoing transitions. That leads $N(r_1 \cdot r_2 \cdot r_3)$ to one as shown in FIG. 6C.

Figure 6D:
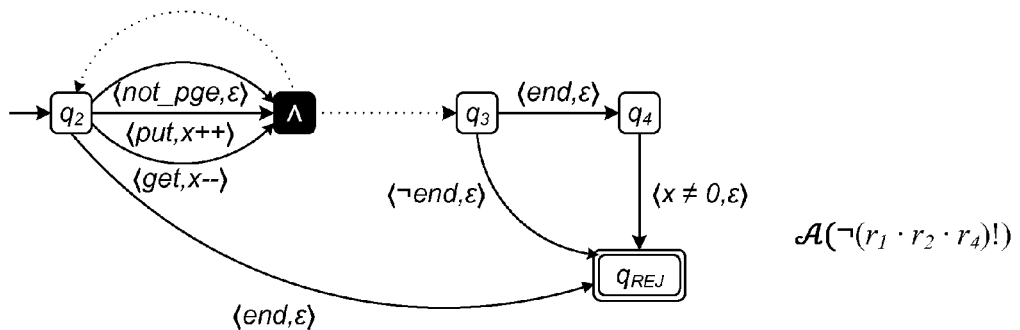
FIG. 6D illustrates an automaton after combining three automata from FIG. 6A, needed for the third exemplary temporal logic.

Subsequent automata are presented in FIG. 6D after above simple optimization. The formula $\neg \varphi_3$ requires negating a regular expression with local variables assignment which is not supported by the syntax restrictions of $PSL^{pract}$. We provide the construction nonetheless, as if it were not, in order to exemplify that the obtain automata will not be conflict-free.

Figure 6E:
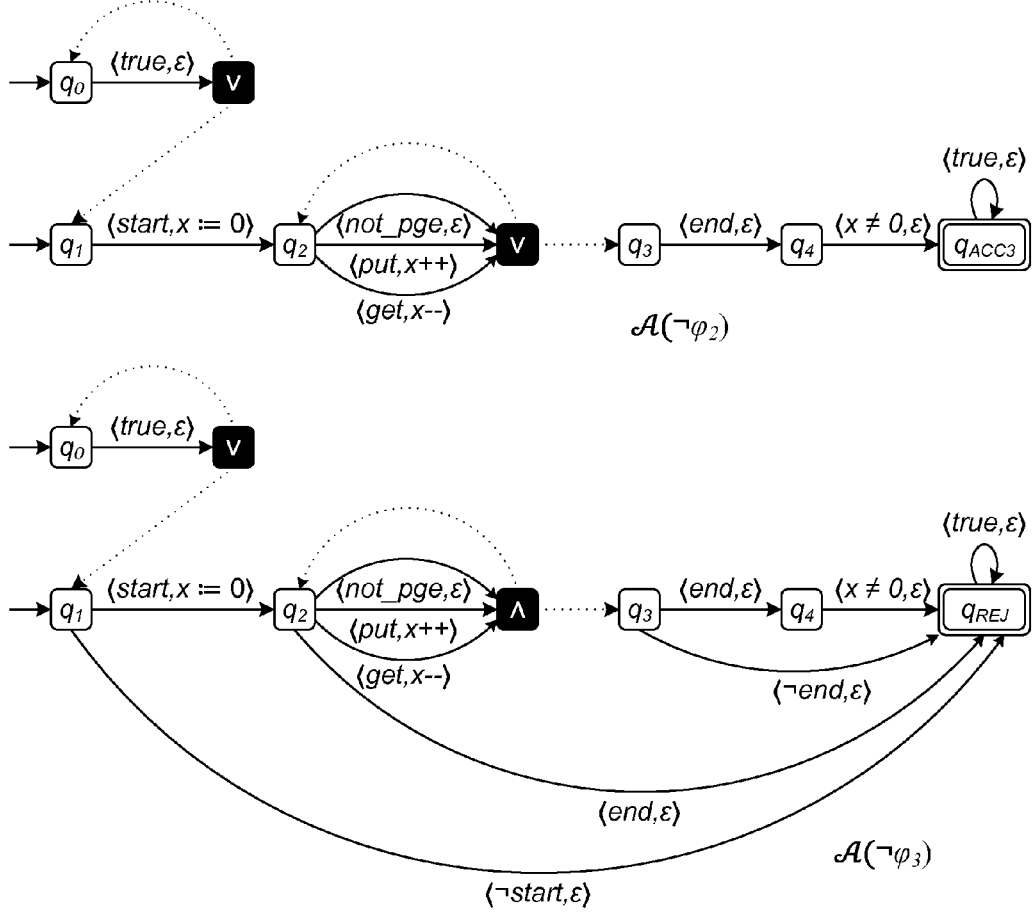
FIG. 6E illustrates two complete annotated alternating automata for the second and third exemplary temporal logic formulae.

By Lemma 13, we obtain the automata shown in FIG. 6E. The automaton for $\neg \varphi_2$ is conflict-free as there are no universal branches in it. The automaton for $\neg \varphi_3$ is not conflict-free since there is an assignment to local variable after a universal branch. This will potentially lead to a run-tree where decedents of the same node disagree on the value of the local variable.

What is claimed is:

1. A method for verifying whether a hardware design satisfies a temporal property, the method comprising a processor executing the steps of:
   accessing a hardware description language (HDL) description of the hardware design;
   accessing the temporal property, the temporal property expressed using a local variable;
   creating a parse tree for the temporal property;
   determining whether the temporal property is a member of a practical subset of temporal properties based on analyzing the parse tree, wherein every member of the practical subset possesses an alternating automaton with no conflicts; and
   (a) formally verifying whether the hardware design satisfies the temporal property for all such temporal properties that are determined to be members of the practical subset; or (b) not formally verifying whether the hardware design satisfies the temporal property for all such temporal properties that are determined not to be members of the practical subset.

2. The method of claim 1 wherein the practical subset of temporal properties includes any temporal property in which all local variables are limited to temporal operators next!, until!, releases and suffix implication, as long as there are no assignments to local variables on either the right operand of until! or the left operand of releases.

3. The method of claim 2 wherein the step of determining whether a temporal property is a member of the practical subset of temporal properties comprises determining that the temporal property is not a member of the practical subset if the temporal property includes an assignment to a local variable on the right operand of until!.

4. The method of claim 2 wherein the step of determining whether a temporal property is a member of the practical subset of temporal properties comprises determining that the temporal property is not a member of the practical subset if the temporal property includes an assignment to a local variable on the left operand of releases.

5. The method of claim 2 wherein the step of determining whether a temporal property is a member of the practical subset of temporal properties is based on analyzing operators and operands of the temporal property.

6. The method of claim 2 wherein the step of determining whether a temporal property is a member of the practical subset of temporal properties comprises:
   constructing an alternating automaton for the temporal property; and
   determining whether the alternating automaton has no conflicts.

7. The method of claim 1 wherein formal verification of any member of the practical subset of temporal properties has complexity PSPACE or less.

8. The method of claim 1 wherein the hardware design is denoted D, the temporal property is denoted P, and the step of formally verifying whether the hardware design D satisfies the temporal property P comprises:
   constructing an alternating automaton A recognizing the negation of temporal property P;
   converting A into a non-deterministic automaton N and a deterministic satellite machine S such that the product N×S recognizes the same set of words as A; and
   formally verifying whether D×N×S is empty.

9. The method of claim 8 wherein the alternating automaton A is annotated, and the step of converting A uses the annotations to identify which portions of A are converted to the non-deterministic automaton N and which portions of A are converted to the deterministic satellite machine S.

10. The method of claim 8 wherein the deterministic satellite machine S handles updates of local variables.

11. The method of claim 1 wherein the step of formally verifying whether the hardware design satisfies the temporal property comprises formally verifying whether a Cartesian product of the hardware design with an automaton for a negation of the temporal property is empty.

12. The method of claim 1 wherein the temporal property is expressed using SystemVerilog Assertions.

13. The method of claim 1 wherein the temporal property is expressed using Property Specification Language.

14. The method of claim 1 wherein the HDL description includes a Verilog description of the hardware design.

15. The method of claim 1 wherein the HDL description includes a Very High Speed Integrated Circuit (VHSIC) Hardware Description Language (VHDL) description of the hardware design.

16. A system for verifying whether a hardware design satisfies a temporal property, the system comprising:
   means for accessing a hardware description language (HDL) description of the hardware design;
   means for accessing the temporal property, the temporal property expressed using a local variable;
   means for creating a parser tree for the temporal property;
   means for determining whether the temporal property is a member of a practical subset of temporal properties based on analyzing the parse tree, wherein every member of the practical subset possesses an alternating automaton with no conflicts; and
   means for (a) formally verifying whether the hardware design satisfies the temporal property for all such temporal properties that are determined to be members of the practical subset; or (b) not formally verifying whether the hardware design satisfies the temporal property for all such temporal properties that are determined not to be members of the practical subset.

17. The system of claim 16 further comprising:
   means for constructing an alternating automaton A recognizing the negation of temporal property P;
   means for converting A into a non-deterministic automaton N and a deterministic satellite machine S such that the product N×S recognizes the same set of words as A; and
   means for formally verifying whether D×N×S is empty.

* * * * *